(12) United States Patent
Choi et al.

(10) Patent No.: US 11,631,724 B2
(45) Date of Patent: Apr. 18, 2023

(54) ELECTROLUMINESCENT DISPLAY DEVICE WITH UNEVEN PATTERN IN NON-DISPLAY AREA

(71) Applicant: LG Display Co., Ltd., Seoul (KR)

(72) Inventors: Jeong-Mook Choi, Paju-si (KR);
Heume-Il Baek, Paju-si (KR);
Nack-Youn Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 129 days.

(21) Appl. No.: 17/115,692

(22) Filed: Dec. 8, 2020

(65) Prior Publication Data
US 2021/0175305 A1 Jun. 10, 2021

(30) Foreign Application Priority Data
Dec. 9, 2019 (KR) .................... 10-2019-0162803

(51) Int. Cl.
*H01L 27/32* (2006.01)

(52) U.S. Cl.
CPC .. *H01L 27/3246* (2013.01); *H01L 2251/5315* (2013.01)

(58) Field of Classification Search
CPC .................. H01L 27/3246; H01L 2251/5315
See application file for complete search history.

(56) References Cited

U.S. PATENT DOCUMENTS

| | | | | |
|---|---|---|---|---|
| 2003/0164674 A1* | 9/2003 | Imamura | ................ | H05B 33/04 313/493 |
| 2005/0264177 A1* | 12/2005 | Chung | ................ | H01L 27/3223 313/506 |
| 2009/0309489 A1* | 12/2009 | Takata | .................. | H01L 51/524 313/504 |
| 2014/0225089 A1* | 8/2014 | Kato | .................... | H01L 27/3246 257/40 |
| 2019/0103442 A1* | 4/2019 | Choi | .................... | H01L 51/5209 |
| 2020/0006458 A1* | 1/2020 | Lim | .................... | H01L 27/3211 |
| 2020/0075699 A1* | 3/2020 | Kim | .................... | H01L 27/3258 |
| 2020/0091257 A1* | 3/2020 | Sun | ..................... | H01L 51/0097 |

(Continued)

FOREIGN PATENT DOCUMENTS

| | | | | |
|---|---|---|---|---|
| CN | 112310178 A | * | 2/2021 | ......... H01L 27/3246 |
| EP | 3490004 A1 | * | 5/2019 | ......... H01L 27/3211 |

*Primary Examiner* — Peter Bradford
(74) *Attorney, Agent, or Firm* — Fenwick & West LLP

(57) ABSTRACT

An electroluminescent display device includes a substrate on which a display area and a non-display area are defined, sub-pixels disposed in the display area on the substrate and arranged along first and second directions, a light-emitting diode disposed at each sub-pixel and including a first electrode, a light-emitting layer and a second electrode, a first bank disposed between adjacent sub-pixels along the second direction and overlapping edges of the first electrode, and a second bank disposed between adjacent sub-pixels along the first direction and having an opening corresponding to a column of the sub-pixels arranged along the second direction, wherein the opening includes a first portion corresponding to the display area and a second portion corresponding to the non-display area, and a bottom surface of the light-emitting layer in the second portion has unevenness, and wherein an uneven pattern is provided under the light-emitting layer in the non-display area.

14 Claims, 13 Drawing Sheets

(56) References Cited

U.S. PATENT DOCUMENTS

| | | | |
|---|---|---|---|
| 2021/0143236 A1* | 5/2021 | Kim .................... | H01L 27/3246 |
| 2021/0175305 A1* | 6/2021 | Choi ................... | H01L 27/3246 |
| 2021/0183964 A1* | 6/2021 | Jang ................... | H01L 51/5225 |
| 2021/0202629 A1* | 7/2021 | Myung ............... | H01L 27/3223 |
| 2022/0115364 A1* | 4/2022 | Jeon ..................... | H01L 25/167 |

\* cited by examiner

ELECTROLUMINESCENT DISPLAY DEVICE WITH UNEVEN PATTERN IN NON-DISPLAY AREA

CROSS-REFERENCE TO RELATED APPLICATION

The present application claims priority from and the benefit under 35 U.S.C. § 119(a) of Republic of Korea Patent Application No. 10-2019-0162803 filed on Dec. 9, 2019, which is hereby incorporated by reference in its entirety.

BACKGROUND

Field of the Disclosure

The present disclosure relates to an electroluminescent display device, and more particularly, to an electroluminescent display device having a large size and high definition.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response speed. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has red, green and blue sub-pixels, and displays various color images by allowing the red, green and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask (FMM).

However, the evaporation process increases manufacturing costs due to preparation of the mask and has a problem in application to a large-sized and high-definition display device due to manufacturing variations, sagging, shadow effect of the mask, and the like.

SUMMARY

Accordingly, the present disclosure is directed to an electroluminescent display device that substantially obviates one or more of the problems due to limitations and disadvantages of the related art.

An object of the present disclosure is to provide an electroluminescent display device having a large size and high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate on which a display area displaying an image and a non-display area disposed outside the display area are defined, a plurality of sub-pixels disposed in the display area on the substrate and arranged along a first direction and a second direction, a light-emitting diode disposed at each of the plurality of sub-pixels and including a first electrode, a light-emitting layer and a second electrode, a first bank disposed between adjacent sub-pixels along the second direction and overlapping edges of the first electrode, and a second bank disposed between adjacent sub-pixels along the first direction and having an opening corresponding to a row of the sub-pixels arranged along the second direction, wherein the opening includes a first portion corresponding to the display area and a second portion corresponding to the non-display area, and a bottom surface of the light-emitting layer in the second portion has unevenness, and wherein an uneven pattern is provided under the light-emitting layer in the non-display area.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure.

DETAILED DESCRIPTION OF THE EMBODIMENT

Reference will now be made in detail to exemplary embodiments of the disclosure, examples of which are illustrated in the accompanying drawings.

An electroluminescent display device according to an embodiment of the present disclosure includes a plurality of pixels to display an image, and each of the plurality of pixels includes red, green and blue sub-pixels. A pixel region corresponding to each sub-pixel can have a configuration shown in FIG. 1.

Figure 1:
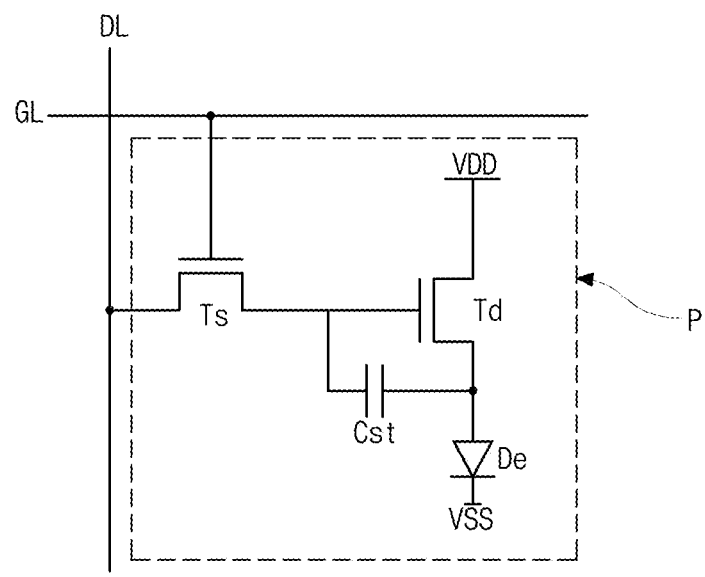
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure.

In FIG. 1, the electroluminescent display device according to the embodiment of the present disclosure includes a plurality of gate lines and a plurality of data lines crossing each other to define a plurality of pixel regions. Particularly, in the example of FIG. 1, a gate line GL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the pixel region P in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

Figure 2:
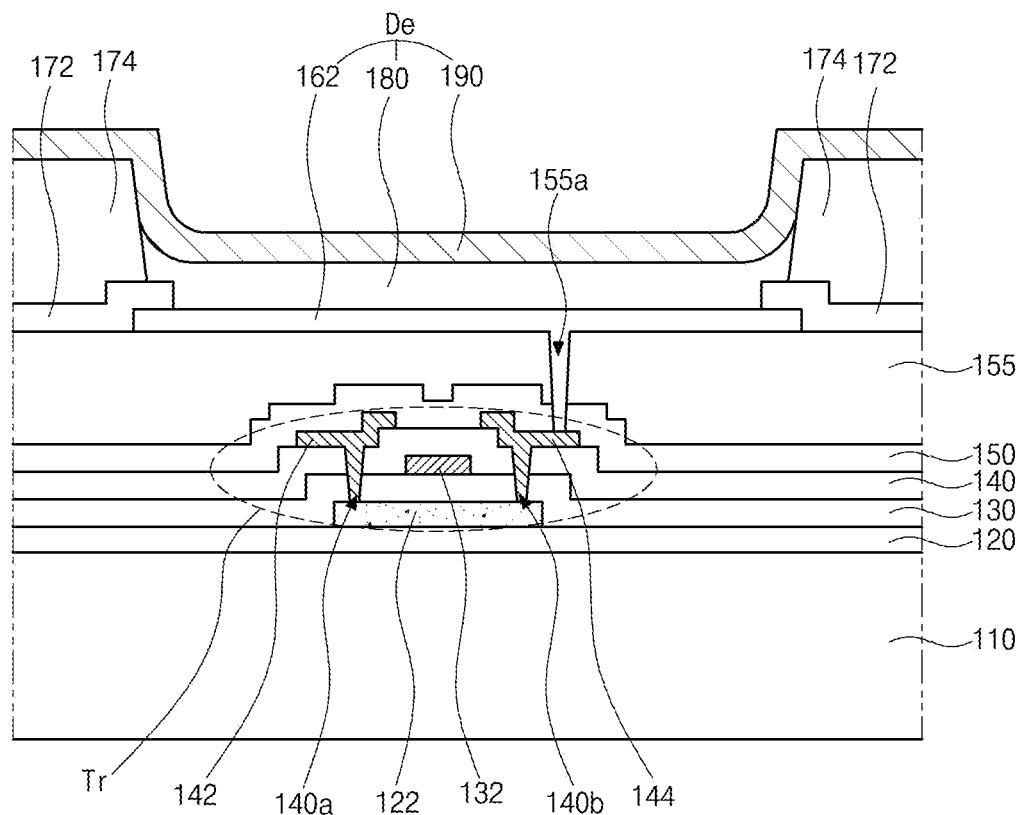
FIG. 2 is a schematic cross-sectional of an electroluminescent display device according to the embodiment of the present disclosure.

FIG. 2 is a schematic cross-sectional of an electroluminescent display device according to the embodiment of the present disclosure and shows one pixel region.

In the electroluminescent display device of FIG. 2, a buffer layer 120 is formed on a substrate 110. The buffer layer 120 is disposed substantially on an entire surface of the substrate 110. The substrate 110 can be a glass substrate or a plastic substrate. For example, polyimide can be used as the plastic substrate, but is not limited thereto. The buffer layer 120 can be formed of an inorganic material, such as silicon oxide ($SiO_2$) or silicon nitride ($SiN_x$), and can be a single layer or multiple layers.

A patterned semiconductor layer 122 is formed on the buffer layer 120. The semiconductor layer 122 can be formed of an oxide semiconductor layer, and a light-shielding pattern can be further formed under the semiconductor layer 122. The light-shielding pattern can block light incident on the semiconductor layer 122 and can prevent the semiconductor layer 122 from deteriorating due to the light. Alternatively, the semiconductor layer 122 can be formed of polycrystalline silicon, and both ends of the semiconductor layer 122 can be doped with impurities.

A gate insulation layer 130 of an insulating material is formed on the semiconductor layer 122 substantially over the entire surface of the substrate 110. The gate insulation layer 130 can be formed of an inorganic insulating material such as silicon oxide ($SiO_2$) or silicon nitride ($SiN_x$). When the semiconductor layer 122 is made of an oxide semiconductor material, the gate insulation layer 130 can be formed of silicon oxide ($SiO_2$). Alternatively, when the semiconductor layer 122 is made of polycrystalline silicon, the gate insulation layer 130 can be formed of silicon oxide ($SiO_2$) or silicon nitride ($SiN_x$).

A gate electrode 132 of a conductive material such as metal is formed on the gate insulation layer 130 corresponding to the center of the semiconductor layer 122. In addition, a gate line and a first capacitor electrode can be formed on the gate insulation layer 130. The gate line extends in a first direction, and the first capacitor electrode is connected to the gate electrode 132.

In the embodiment of the present disclosure, the gate insulation layer 130 is formed over the entire surface of the substrate 110. However, the gate insulation layer 130 can be patterned to have the same shape as the gate electrode 132.

An interlayer insulation layer 140 made of an insulating material is formed on the gate electrode 132 substantially over the entire surface of the substrate 110. The interlayer insulation layer 140 can be formed of an inorganic insulating material such as silicon oxide ($SiO_2$) or silicon nitride ($SiN_x$). Alternatively, the interlayer insulation layer 140 can be formed of an organic insulating material such as photo acryl or benzocyclobutene.

The interlayer insulation layer 140 has first and second contact holes 140a and 140b exposing top surfaces of both ends of the semiconductor layer 122. The first and second contact holes 140a and 140b are disposed at both sides of the gate electrode 132 and spaced apart from the gate electrode 132. The first and second contact holes 140a and 140b are also formed in the gate insulation layer 130. Alternatively, when the gate insulation layer 130 is patterned to have the same shape as the gate electrode 132, the first and second contact holes 140a and 140b are formed only in the interlayer insulation layer 140.

Source and drain electrodes 142 and 144 of a conductive material such as metal are formed on the interlayer insulation layer 140. In addition, a data line, a power supply line and a second capacitor electrode can be further formed on the interlayer insulation layer 140.

The source and drain electrodes 142 and 144 are spaced apart from each other with the gate electrode 132 positioned therebetween and are in contact with both ends of the semiconductor layer 122 through the first and second contact holes 140a and 140b, respectively. The data line extends in a second direction and crosses the gate line to thereby define a pixel region. The power supply line for supplying a high voltage is spaced apart from the data line. The second capacitor electrode is connected to the drain electrode 144. The second capacitor electrode overlaps the first capacitor electrode to thereby constitute a storage capacitor with the interlayer insulation layer 140 therebetween as a dielectric. Alternatively, the first capacitor electrode can be connected to the drain electrode 144, and the second capacitor electrode can be connected to the gate electrode 132.

The semiconductor layer 122, the gate electrode 132, and the source and drain electrodes 142 and 144 form a thin film transistor Tr. The thin film transistor Tr has a coplanar structure in which the gate electrode 132 and the source and drain electrodes 142 and 144 are located at the same side with respect to the semiconductor layer 122.

Alternatively, the thin film transistor Tr can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. The semiconductor layer can be formed of oxide semiconductor or amorphous silicon.

The thin film transistor Tr corresponds to a driving thin film transistor Td of FIG. 1, and a switching thin film transistor Ts of FIG. 1 having the same structure as the driving thin film transistor Td can be further formed in the pixel region on the substrate 110. The gate electrode 132 of the driving thin film transistor Td can be connected to a drain electrode of the switching thin film transistor, and the source electrode 142 of the driving thin film transistor Td is connected to the power supply line. In addition, a gate electrode and a source electrode of the switching thin film transistor can be connected to the gate line and the data line, respectively.

A sensing thin film transistor having the same structure of the driving thin film transistor Td can be further formed in the pixel region on the substrate 110, but the present disclosure is not limited thereto.

A passivation layer 150 of an insulating material is formed on the source and drain electrodes 142 and 144 substantially over the entire surface of the substrate 110. The passivation layer 150 can be formed of an inorganic insulating material such as silicon oxide ($SiO_2$) or silicon nitride ($SiN_x$).

An overcoat layer 155 of an insulating material is formed on the passivation layer 150 substantially over the entire surface of the substrate 110. The overcoat layer 155 can be formed of an organic insulating material such as photo acryl or benzocyclobutene. The overcoat layer 155 can have a flat top surface.

The overcoat layer 155 and the passivation layer 150 have a drain contact hole 155a exposing the drain electrode 144. The drain contact hole 155a can be spaced apart from the second contact hole 140b. Alternatively, the drain contact hole 155a can be disposed right over the second contact hole 140b.

A first electrode 162 is formed on the overcoat layer 155 and formed of a conductive material having a relatively high work function. The first electrode 162 is disposed in the pixel region and is in contact with the drain electrode 144 through the drain contact hole 155a. For example, the first electrode 162 can be formed of a transparent conductive material such as indium tin oxide (ITO) or indium zinc oxide (IZO), but is not limited thereto.

The electroluminescent display device according to the embodiment of the present disclosure is a top emission type in which light of a light-emitting diode De is output toward a direction opposite the substrate 110. Accordingly, the first electrode 162 can further include a reflective electrode or a reflective layer formed of a metal material having a relatively high reflectance below the transparent conductive material. For example, the reflective electrode or reflective layer can be formed of an aluminum-palladium-copper (APC) alloy, silver (Ag) or aluminum (Al). The first electrode 162 can have a triple-layer structure of ITO/APC/ITO, ITO/Ag/ITO or ITO/Al/ITO, but is not limited thereto.

A bank of an insulating material is formed on the first electrode 162. The bank can include a first bank 172 of a hydrophilic property and a second bank 174 of a hydrophobic property.

More particularly, the first bank 172 overlaps and covers edges of the first electrode 162 and exposes a central portion of the first electrode 162. The first bank 172 can be formed of a material having a hydrophilic property, for example, an inorganic insulating material such as silicon oxide ($SiO_2$) or silicon nitride ($SiN_x$). Alternatively, the first bank 172 can be formed of polyimide.

The second bank 174 is formed on the first bank 172. At this time, at least an upper surface of the second bank 174 is hydrophobic, and a side surface of the second bank 174 can be hydrophobic or hydrophilic.

The second bank 174 has a narrower width than the first bank 172, is disposed on the first bank 172, and exposes edges of the first bank 172. A thickness of the second bank 174 can be greater than a thickness of the first bank 172. The second bank 174 can overlap the edges of the first electrode 162. Alternatively, the second bank 174 can be spaced apart from the first electrode 162 without an overlap.

The second bank 174 can be formed of an organic insulating material having a hydrophobic property. Alternatively, the second bank 174 can be formed of an organic insulating material having a hydrophilic property and can be subjected to a hydrophobic treatment.

Meanwhile, only the first bank 172 can be disposed on other edges of the first electrode 162 not shown in the figure. In addition, even if the first and second banks 172 and 174 are formed on the edges of the first electrode 162 in FIG. 2, the first bank 172 can be omitted, and only the second bank 174 can overlap and cover the edges of the first electrode 162.

In FIG. 2, the first bank 172 and the second bank 174 are separately formed of different materials. However, the hydrophilic first bank 172 and the hydrophobic second bank 174 can be formed of the same material and formed as one body. For example, after an organic material layer having an upper surface of a hydrophobic is be formed substantially over the entire surface of the substrate 110, the organic material layer can be exposed to light using a halftone mask, which includes a light-transmitting portion, a light-blocking portion and a half light-transmitting portion, and can be patterned, thereby forming the first bank 172 and the second bank 174 having different widths and thicknesses.

In addition, the drain contact hole 155a is spaced apart from the first and second banks 172 and 174, but is not limited thereto. Alternatively, the drain contact hole 155a can be disposed right under the first and second banks 172 and 174.

Next, a light-emitting layer 180 is formed on the first electrode 162 exposed by the first and second banks 172 and 174.

The light-emitting layer 180 can include a first charge auxiliary layer, a light-emitting material layer, and a second charge auxiliary layer that are sequentially positioned over the first electrode 162. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

The light-emitting layer 180 is formed through a solution process. Thus, the process can be simplified and a display device with a large size and high resolution can be provided. A spin coating method, an ink jet printing method, or a screen printing method can be used as the solution process, but the present disclosure is not limited thereto.

When the solution is dried, a drying speed of a solvent in a region adjacent to the second bank 174 is different from that in other regions. That is, the drying speed of the solvent in the region adjacent to the second bank 174 is faster than that in the other regions. Therefore, a height of the light-emitting layer 180 in the region adjacent to the second bank 174 can rise as it gets closer to the second bank 174.

Meanwhile, among the layers of the light-emitting layer 180, the electron auxiliary layer can be formed through a thermal evaporation process. At this time, the electron auxiliary layer can be formed substantially over the entire surface of the substrate 110.

A second electrode 190 of a conductive material having a relatively low work function is formed on the light-emitting layer 180 substantially over the entire surface of the substrate 110. The second electrode 190 can be formed of aluminum (Al), magnesium (Mg), silver (Ag), or an alloy thereof. The second electrode 190 has a relatively thin thickness such that light from the light-emitting layer 180 can be transmitted therethrough. Alternatively, the second electrode 190 can be formed of a transparent conductive material such as indium-gallium-oxide (IGO), but is not limited thereto.

The first electrode 162, the light-emitting layer 180 and the second electrode 190 constitute a light-emitting diode De. The first electrode 162 can serve as an anode, and the second electrode 190 can serve as a cathode, but is not limited thereto.

As described above, the electroluminescent display device according to the embodiment of the present disclosure can be a top emission type in which light from the light-emitting layer 180 of the light-emitting diode De is output toward a direction opposite the substrate 110, that is, output to the outside through the second electrode 190. The top emission type display device can have a wider emission area than a bottom emission type display device of the same size, to thereby improve luminance and reduce power consumption.

The light-emitting diode De of each pixel region can have an element thickness for a micro-cavity effect corresponding to a wavelength of the emitted light, thereby increasing the light efficiency. Here, the element thickness can be defined as a distance between the first electrode 162 and the second electrode 190, but is not limited thereto.

In addition, a protective layer and/or an encapsulating layer can be formed on the second electrode 190 substantially over the entire surface of the substrate 110 to block moisture or oxygen introduced from the outside, thereby protecting the light-emitting diode De.

As described above, in the electroluminescent display device according to the embodiment of the present disclosure, by forming some of the light-emitting layer 180 through the solution process, a fine metal mask is omitted to thereby reduce the manufacturing costs, and a display device with a large size and high definition can be implemented.

By the way, when the light-emitting layer 180 is formed through the solution process, the solution is dropped in each of a plurality of sub-pixels at a time, and to do this, different nozzles are used for respective sub-pixels. However, a variation in the thickness of a thin film formed in each sub-pixel occurs due to a deviation in the dropping amounts of the nozzles. Accordingly, in the present disclosure, the light-emitting layers 180 of the same color sub-pixels are connected to each other to thereby form one body. Thus, the deviation in the dropping amounts of the nozzles is minimized, and thicknesses of the light-emitting layers 180 formed in the respective sub-pixels can be uniform.

The configuration of the electroluminescent display device according to a first embodiment of the present disclosure will be described with reference to FIG. 3.

Figure 3:
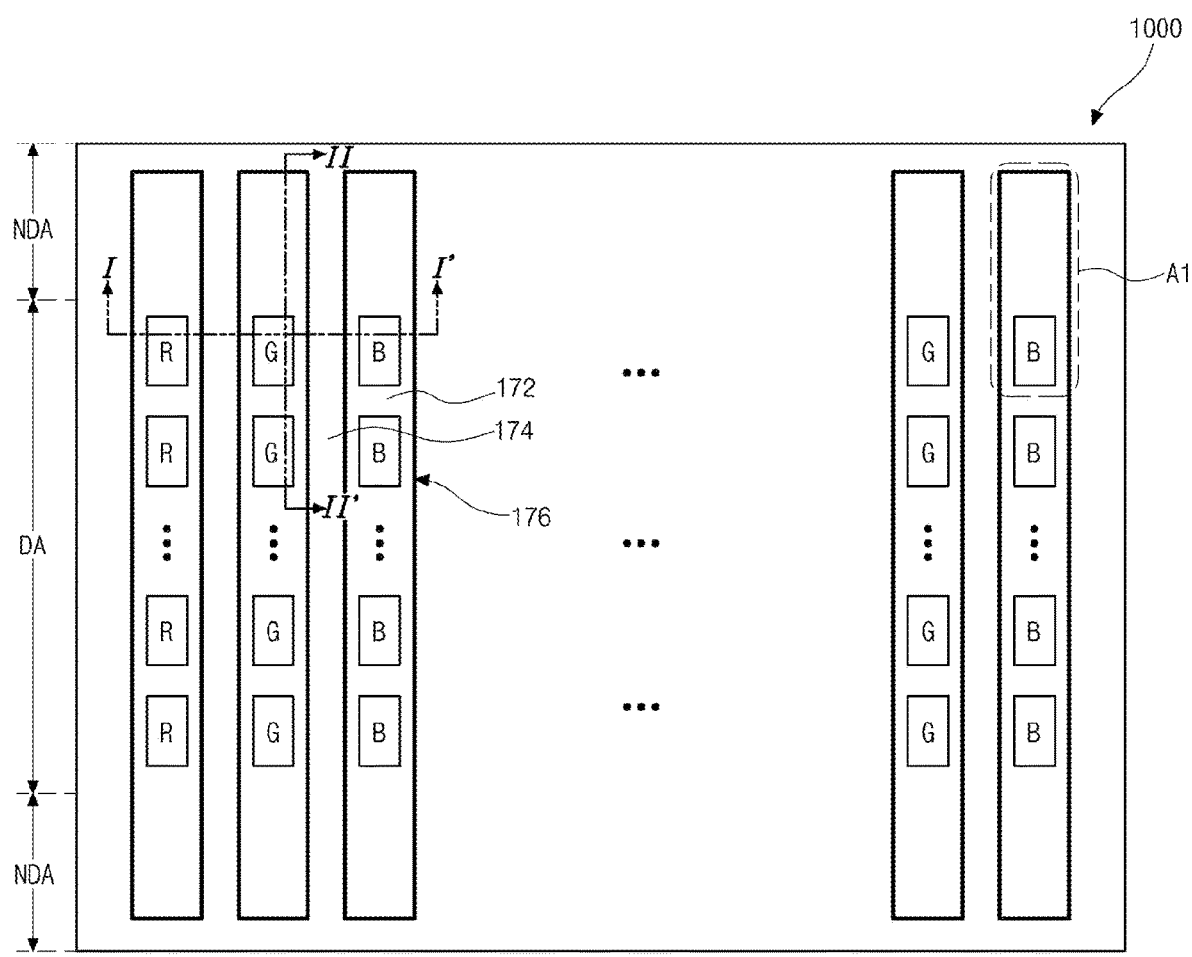
FIG. 3 is a schematic plan view of an electroluminescent display device according to a first embodiment of the present disclosure.

FIG. 3 is a schematic plan view of an electroluminescent display device according to a first embodiment of the present disclosure and mainly shows a bank configuration.

In FIG. 3, the electroluminescent display device 1000 according to the first embodiment of the present disclosure includes a display area DA displaying an image and a non-display area NDA disposed outside the display area DA. Here, the non-display area NDA is illustrated to be disposed up and down the display area DA, but is not limited thereto.

Alternatively, the non-display area NDA can be disposed left and right the display area DA.

In the display area DA, red, green and blue sub-pixels R, G and B are disposed. The red, green and blue sub-pixels R, G and B are sequentially arranged along a first direction, and the same color sub-pixels R, G and B are arranged along a second direction. For example, R, G and B sub-pixels are repeatedly arranged in that order along the first direction (e.g., horizontal direction), whereas a column of R sub-pixels, a column of G sub-pixels, and a column of B sub-pixels are repeatedly arranged in that order along the second direction (e.g., vertical direction). Here, the red, green and blue sub-pixels R, G and B are shown to each have a rectangular shape, but is not limited thereto. The red, green and blue sub-pixels R, G and B each can have various shapes such as a rectangular shape with rounded corners, an oval shape, or the like.

A first bank 172 of a hydrophilic property is disposed between adjacent same color sub-pixels R, G and B and between adjacent different color sub-pixels R, G and B. Alternatively, the first bank 172 can be omitted between the adjacent different color sub-pixels R, G and B. That is, the first bank 172 can be formed between the adjacent sub-pixels R, G and B along the second direction and can extend along the first direction.

In addition, the first bank 172 is also disposed in the non-display area NDA and can be formed to enclose all the sub-pixels R, G and B.

A second bank 174 of a hydrophobic property is disposed on the first bank 172. In the display area DA, the second bank 174 has an opening 176 corresponding to a same color sub-pixel column and is disposed between adjacent different color sub-pixels R, G and B. Accordingly, the opening 176 extends in the second direction, and the opening 176 has a length of the second direction greater than a length of the first direction, i.e., a width. In other words, the opening 176 has a short side parallel to the first direction and a long side parallel to the second direction. At this time, the second bank 174 can have a narrower width than the first bank 172 between adjacent different color sub-pixels R, G and B.

In addition, the second bank 174 is also disposed in the non-display area NDA, and the opening 176 of the second bank 174 extends into the non-display area NDA. Here, at least one uneven pattern (not shown) can be provided to correspond to the opening 176 in the non-display area NDA, and this will be described in detail later.

Meanwhile, although not shown in the figure, a plurality of dummy sub-pixels can be provided in the non-display area NDA, and the opening 176 of the second bank 174 can be formed to correspond to the dummy sub-pixels. At this time, one or more dummy sub-pixels can be disposed at each of upper and lower sides of each sub-pixel column. The dummy sub-pixels can have the same configuration as the red, green and blue sub-pixels R, G and B except for a connection structure. Alternatively, the dummy sub-pixels can have different configuration from the red, green and blue sub-pixels R, G and B.

A cross-sectional structure of the electroluminescent display device 1000 according to the first embodiment of the present disclosure will be described with reference to FIG. 4 and FIG. 5.

Figure 4:
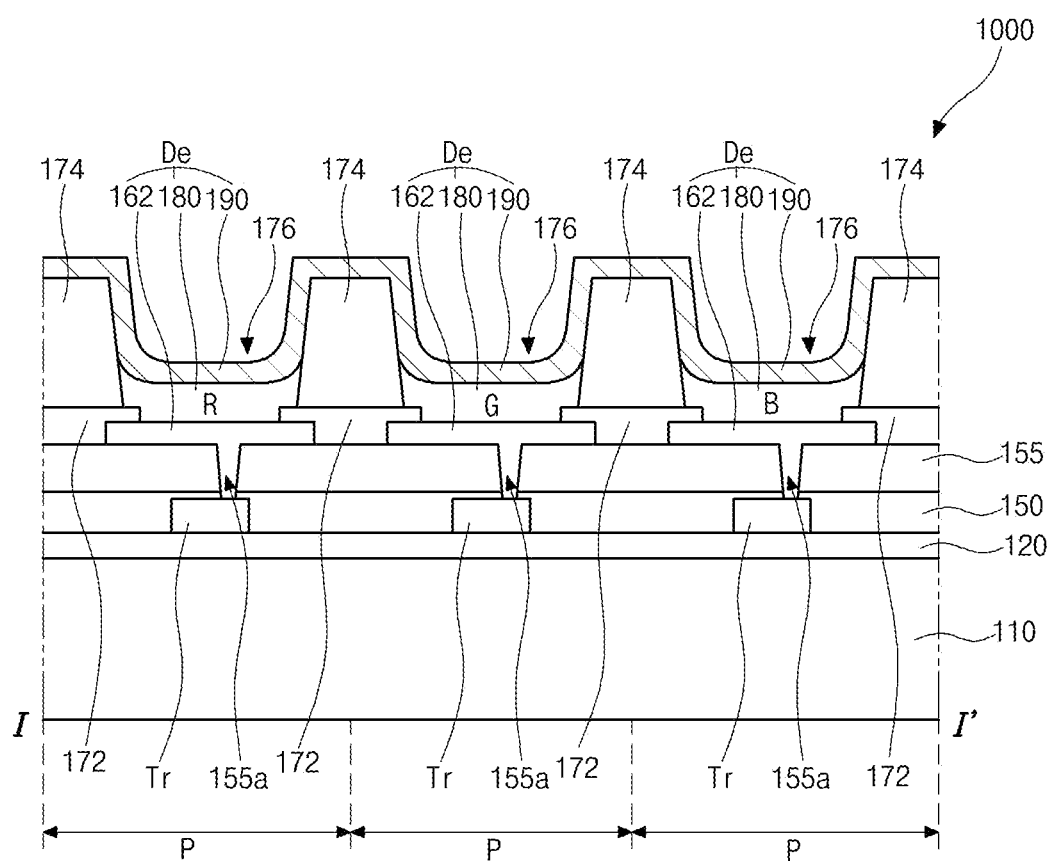
FIG. 4 is a cross-sectional view corresponding to the line I-I' of FIG. 3 according to an embodiment of the present disclosure.
Figure 5:
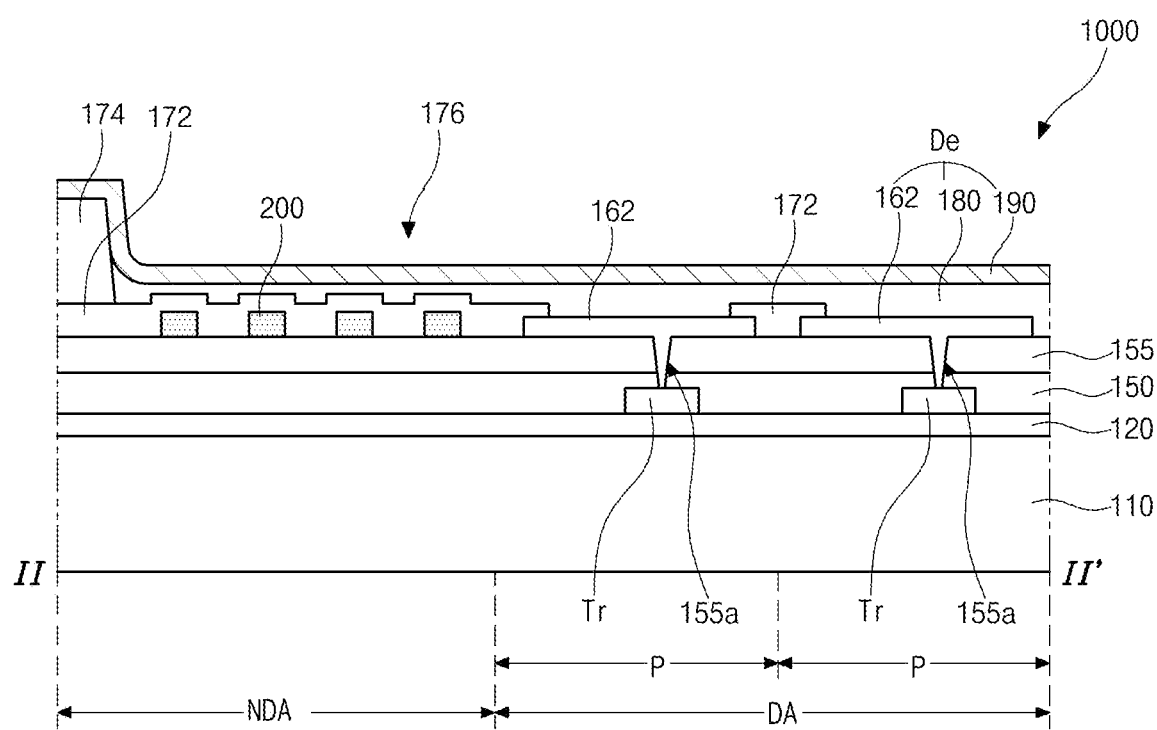
FIG. 5 is a cross-sectional view corresponding to the line II-II' of FIG. 3 according to an embodiment of the present disclosure.

FIG. 4 is a cross-sectional view corresponding to the line I-I' of FIG. 3, and FIG. 5 is a cross-sectional view corresponding to the line II-II' of FIG. 3 according to an embodiment of the present disclosure.

As shown in FIG. 4 and FIG. 5, in the electroluminescent display device 1000 according to the first embodiment of the present disclosure, a display area DA and a non-display area NDA are defined on a substrate 110, and a plurality of pixel regions P respectively corresponding to red, green and blue sub-pixels R, G and B are defined in the display area DA. A buffer layer 120 is formed substantially on an entire surface of the substrate 110, and the buffer layer 120 is disposed in both the display area DA and the non-display area NDA.

Next, a thin film transistors Tr is formed on the buffer layer 120 in each pixel region P. A passivation layer 150 and an overcoat layer 155 are sequentially formed on the thin film transistor Tr substantially over the entire surface of the substrate 110, and the passivation layer 150 and the overcoat layer 155 are disposed in both the display area DA and the non-display area NDA. Next, a first electrode 162 is formed on the overcoat layer 155 in each pixel region P.

Here, the thin film transistor Tr can have the configuration shown in FIG. 2, but is not limited thereto. In addition, although not shown in the figure, a gate insulation layer and an interlayer insulation layer can be further formed between the buffer layer 120 and the passivation layer 150.

In each pixel region P, the overcoat layer 155 has a drain contact hole 155a exposing a part of the thin film transistor Tr, that is, a drain electrode together with the passivation layer 150. The first electrode 162 contacts the drain electrode of the thin film transistor Tr through the drain contact hole 155a.

In addition, at least one uneven pattern 200 is formed on the overcoat layer 155 in the non-display area NDA. The uneven pattern 200 can be formed of an inorganic insulating material such as silicon oxide ($SiO_2$) or silicon nitride ($SiN_x$). However, the present disclosure is not limited thereto, and the uneven pattern 200 can be formed of a metal material.

It is preferable that a thickness of the uneven pattern 200 is equal to or more than 30 nm. Further, the thickness of the uneven pattern 200 can be equal to or less than 500 nm, but is not limited thereto.

On the other hand, when the dummy sub-pixels are provided in the non-display area NDA, a dummy thin film transistor having the same configuration as the thin film transistor Tr of the pixel region P can be formed between the buffer layer 120 and the passivation layer 150 in each dummy sub-pixel, and a dummy electrode can be formed on the overcoat layer 155 in each dummy sub-pixel. At this time, the uneven pattern 200 can be formed on the dummy electrode. Here, the passivation layer 150 and the overcoat layer 155 do not have a drain contact hole exposing the dummy thin film transistor in the dummy sub-pixel, and thus the dummy electrode is not connected to the dummy thin film transistor in the dummy sub-pixel.

However, the configuration of the dummy sub-pixel is not limited thereto. For example, at least one of the dummy thin film transistor and the dummy electrode can be omitted.

A first bank 172 of a hydrophilic property is formed on the first electrode 162. The first bank 172 overlaps and covers edges of the first electrode 162. The first bank 172 is formed between adjacent same color sub-pixels R, G and B and between adjacent different color sub-pixels R, G and B. Alternatively, the first bank 172 can be omitted between adjacent different color sub-pixels R, G and B and can be disposed only between adjacent same color sub-pixels R, G and B.

In addition, the first bank 172 can be formed substantially all over the non-display area NDA and can cover the uneven pattern 200. At this time, a top surface of the first bank 172 of the non-display area NDA has unevenness due to the uneven pattern 200. Alternatively, the first bank 172 can be removed in the non-display area NDA, and the uneven pattern 200 can be exposed.

Meanwhile, when the dummy sub-pixel is provided in the non-display area NDA, the first bank 172 can overlap and cover edges of the dummy electrode and expose a central portion of the dummy electrode.

The first bank 172 can be formed of a material having a hydrophilic property, for example, an inorganic insulating material such as silicon oxide ($SiO_2$) or silicon nitride ($SiN_x$). Alternatively, the first bank 172 can be formed of polyimide.

A second bank 174 of a hydrophobic property is formed on the first bank 172. The second bank 174 has a thicker thickness than the first bank 172. The second bank 174 is formed only between adjacent different color sub-pixels R, G and B and may not formed between adjacent same color sub-pixels R, G and B. A width of the second bank 174 is narrower than a width of the first bank 172 between adjacent different color sub-pixels R, G and B.

The second bank 174 has an opening 176 corresponding to a same color sub-pixel column and exposes the first electrodes 162 of the same color sub-pixel column and the first bank 172 between adjacent first electrodes 162 through the opening 176. In addition, the opening 176 extends into the non-display area NDA and exposes the first bank 172 on the uneven pattern 200.

Here, when the first bank 172 is omitted between adjacent different color sub-pixels R, G and B, the second bank 174 contacts and overlaps edges of each first electrode 162 of FIG. 4 and covers the edges of each first electrode 162 of FIG. 4.

The second bank 174 can be formed of an organic insulating material having a hydrophobic property. Alternatively, the second bank 174 can be formed of an organic insulating material having a hydrophilic property and can be subjected to a hydrophobic treatment.

The first bank 172 and the second bank 174 can be formed of the same material and formed as one body. At this time, the first bank 172 and the second bank 174 can be formed through a half-tone mask process.

A light-emitting layer 180 is formed on the first electrode 162 exposed through the opening 176 of the second bank 174 in each pixel region P. Here, a red light-emitting layer is formed in the red sub-pixel R, a green light-emitting layer is formed in the green sub-pixel G, and a blue light-emitting layer is formed in the blue sub-pixel B.

In addition, the light-emitting layer 180 is also formed on the first bank 172 exposed through the opening 176 of the second bank 174 between adjacent same color sub-pixels R, G and B. Namely, in FIG. 5, the green light-emitting layer 180 is also formed on the first bank 172 exposed through the opening 176 of the second bank 174 between adjacent green sub-pixels G. At this time, the light-emitting layer 180 on the first bank 172 is connected to the light-emitting layer 180 on the first electrode 162 in each pixel region P adjacent thereto to thereby form one body.

Meanwhile, as described above, the opening 176 of the second bank 174 extends into the non-display area NDA, and thus, the light-emitting layer 180 is also formed in the non-display area NDA. The light-emitting layer 180 of the non-display area NDA is connected to the light-emitting layer 180 of the pixel region P of the display area DA to thereby form one body. At this time, the opening 176 of the second bank 174 exposes the first bank 172 on the uneven pattern 200 of the non-display area NDA, and the light-emitting layer 180 is formed on the first bank 172 of the non-display area NDA.

Here, since the top surface of the first bank 172 has the unevenness, a bottom surface of the light-emitting layer 180, which contacts the top surface of the first bank 172, also has unevenness. At this time, a concave portion of the bottom surface of the light-emitting layer 180 corresponds to a convex portion of the top surface of the first bank 172, and a convex portion of the bottom surface of the light-emitting layer 180 corresponds to a concave portion of the top surface of the first bank 172.

Alternatively, the first bank 172 can be removed in the non-display area NDA. In this case, the opening 176 of the second bank 174 can expose the uneven pattern 200 and the overcoat layer 155 of the non-display area NDA, and the light-emitting layer 180 can be in contact with the uneven pattern 200 and the overcoat layer 155 of the non-display area NDA.

At this time, the bottom surface of the light-emitting layer 180 can have the unevenness due to the uneven pattern 200, the concave portion of the bottom surface of the light-emitting layer 180 can correspond to the uneven pattern 200, and the convex portion of the bottom surface of the light-emitting layer 180 can correspond to an area between adjacent uneven patterns 200.

The light-emitting layer 180 is formed through a solution process. Here, the solutions dropped into respective pixel regions P corresponding to the same color sub-pixels, for example, the green sub-pixel column, through different nozzles are connected to each other, and the light-emitting layer 180 is formed by drying the solutions. Accordingly, a deviation in the dropping amounts between the nozzles is minimized, and thicknesses of the light-emitting layers 180 formed in the respective pixel regions P can be uniform.

At this time, since the configuration under the light-emitting layer 180 corresponding to the non-display area NDA, that is, the top surface of the first bank 172 is configured to have the unevenness due to the uneven pattern 200, a contact area between the light-emitting layer 180 and the first bank 172 in the non-display area NDA increases, and adhesion and frictional force between the light-emitting layer 180 and the first bank 172 increase. Accordingly, it is prevented that the solution dropped in the opening 176 is concentrated into the center of the display area DA.

Next, a second electrode 190 is formed on the light-emitting layer 180 and the second bank 174. Here, the second electrode 190 is also formed on a top surface and a side surface of the second bank 174 and is in contact with the top surface and the side surface of the second bank 174.

The first electrode 162, the light-emitting layer 180 and the second electrode 190 constitute a light-emitting diode De.

As described above, in the electroluminescent display device 1000 according to the first embodiment of the present disclosure, the light-emitting layers 180 of the same color sub-pixels R, G and B are connected to each other and formed as one body, thereby reducing or minimizing the deviation in the dropping amounts between the nozzles and uniformly forming the thicknesses of the light-emitting layers 180 of the sub-pixels R, G and B. Therefore, the mura can be prevented, thereby preventing the image quality of the display device from being lowered.

In addition, the top surface of the first bank 172 under the light-emitting layer 180 corresponding to the non-display area NDA has the unevenness due to the uneven pattern 200, and the adhesion and the frictional force between the light-emitting layer 180 and the first bank 172 in the non-display area NDA increase. Accordingly, it can be prevented that the solution dropped in the opening 176 is concentrated into the center of the display area DA, thereby preventing the problem that the light-emitting layer 180 is not formed in the pixel regions P disposed at both ends of the same color sub-pixel column.

The uneven pattern according to the first embodiment of the present disclosure will be described in detail with reference to FIG. 6.

Figure 6:
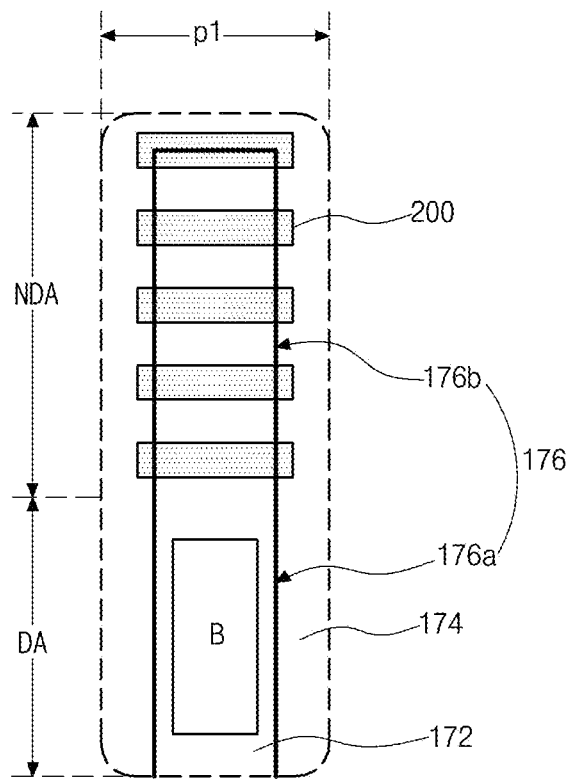
FIG. 6 is a schematically enlarged plan view of the electroluminescent display device according to the first embodiment of the present disclosure.

FIG. 6 is a schematically enlarged plan view of the electroluminescent display device according to the first embodiment of the present disclosure and shows the region A1 of FIG. 3.

In FIG. 6, the display area DA and the non-display area NDA are defined, and the first bank 172 of the hydrophilic property is formed to surround each sub-pixel B of the display area DA. Alternatively, the first bank 172 can be disposed only at upper and lower sides of the each sub-pixel B.

In addition, the first bank 172 is formed substantially all over the non-display area NDA. Alternatively, the first bank 172 can be removed in the non-display area NDA.

The second bank 174 of the hydrophobic property is formed on the first bank 172. The second bank 174 has the opening 176 corresponding to the same color sub-pixel column.

The opening 176 includes a first portion 176a disposed in the display area DA and a second portion 176b disposed in the non-display area NDA. The opening 176 has the width along the first direction and the length along the second direction perpendicular to the first direction.

At this time, the length of the first portion 176a of the opening 176 corresponds to a length of the same color sub-pixel column arranged along the second direction, and the length of the second portion 176b is greater than a length of each sub-pixel B along the second direction. The length of the second portion 176b can be 10 times or less of the length of the sub-pixel B, and beneficially, can be 5 times or more and 10 times or less the length of the sub-pixel B. For example, the length of the second portion 176b can be 1 mm or more, but is not limited thereto.

Further, the first portion 176a and the second portion 176b of the opening 176 can have the same width.

Meanwhile, a plurality of uneven patterns 200 are formed in the non-display area NDA. The uneven patterns 200 can be disposed under the first bank 172. Alternatively, the first bank 172 can be removed in the non-display area NDA, and the uneven patterns 200 can be exposed.

The uneven patterns 200 extend along the first direction and are spaced apart from each other along the second direction. Accordingly, each uneven pattern 200 has a length along the first direction and a width along the second direction.

The uneven patterns 200 can have the same length. Alternatively, the uneven patterns 200 can have different lengths, and the lengths of the uneven patterns 200 can increase or decrease as it gets far from the first portion 176a of the opening 176 along the second direction.

The lengths of the uneven patterns 200 can be greater than 0 and equal to or less than a pixel pitch p1. Here, the pixel pitch p1 is a pitch of each sub-pixel column and can be a distance between the centers of two sub-pixels adjacent along the first direction. When the lengths of the uneven patterns 200 are the same as the pixel pitch p1, the uneven patterns 200 can be connected to other uneven patterns adjacent thereto along the first direction, respectively.

In addition, the uneven patterns 200 can have the same width. Alternatively, the uneven patterns 200 can have different widths, and the widths of the uneven patterns 200 can increase or decrease as it gets far from the first portion 176a of the opening 176 along the second direction. For example, the widths of the uneven patterns 200 can be 10 μm or more. Further, the widths of the uneven patterns 200 can be 40 μm or less, but is not limited thereto.

A distance between adjacent uneven patterns 200 along the second direction can be the same. Alternatively, the distance between the adjacent uneven patterns 200 can increase or decrease it gets far from the first portion 176a of the opening 176 along the second direction. For example, the distance between the adjacent uneven patterns 200 can be 10 μm or more. In addition, the distance between the adjacent uneven patterns 200 can be 40 μm or less, but is not limited thereto.

At this time, as it gets far from the first portion 176a of the opening 176, the lengths of the uneven patterns 200 may decrease, the widths of the uneven patterns 200 may decrease, or the distance between the adjacent uneven patterns 200 may decrease, thereby further increasing the contact area between the solution dropped in the opening 176 and the under layer thereunder at both ends of the opening 176. Accordingly, it can be further prevented that the solution is concentrated into the center of the display area DA.

As described above, in the electroluminescent display device 1000 according to the first embodiment, since the uneven patterns 200 are provided to correspond to the opening 176 of the non-display area NDA and the adhesion and the frictional force between the solution dropped in the opening 176 and the under layer in the non-display area NDA increase, it can be prevented that the solution dropped in the opening 176 is concentrated into the center of the display area DA.

Other examples of an electroluminescent display device including uneven patterns will be described in detail with reference to FIGS. 7A to 7F.

FIGS. 7A to 7F are schematically enlarged plan views for other examples of an electroluminescent display device according to the first embodiment of the present disclosure. The same parts as that of FIG. 6 are designated by the same reference signs, and explanation for the same parts will be shortened or omitted.

Figure 7A:
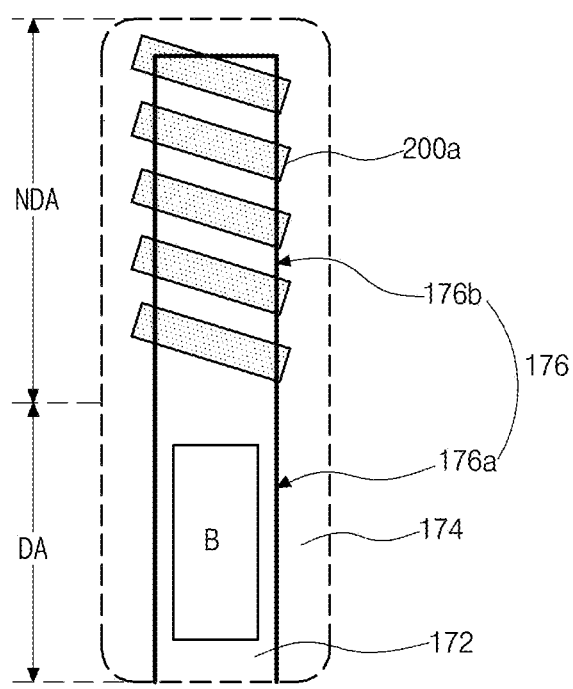
FIGS. 7A to 7F are schematically enlarged plan views for other examples of an electroluminescent display device according to the first embodiment of the present disclosure.

In FIG. 7A, uneven patterns 200a can extend along a third direction crossing the first and second directions. That is, the uneven patterns 200a can be formed to have a predetermined angle with respect to the first direction or the second direction.

As compared with the uneven pattern 200 of FIG. 6, the uneven patterns 200a of FIG. 7A increase the contact area between the solution dropped in the opening 176 and the under layer in the non-display area NDA, and thus it is can be further prevented that the solution dropped in the opening 176 is concentrated into the center of the display area DA.

The uneven patterns 200a can have the same length. Alternatively, the uneven patterns 200a can have different lengths, and the lengths of the uneven patterns 200a can increase or decrease as it gets far from the first portion 176a of the opening 176 along the second direction.

In addition, the uneven patterns 200a can have the same width. Alternatively, the uneven patterns 200a can have different widths, and the widths of the uneven patterns 200a can increase or decrease as it gets far from the first portion 176a of the opening 176 along the second direction.

Further, a distance between adjacent uneven patterns 200a can be the same. Alternatively, the distance between the adjacent uneven patterns 200a can increase or decrease as it gets far from the first portion 176a of the opening 176 along the second direction.

At this time, as it gets far from the first portion 176a of the opening 176, the lengths of the uneven patterns 200a may decrease, the widths of the uneven patterns 200a may decrease, or the distance between the adjacent uneven patterns 200a may decrease, thereby further increasing the contact area between the solution dropped in the opening 176 and the under layer at both ends of the opening 176. Accordingly, it can be further prevented that the solution is concentrated into the center of the display area DA.

Meanwhile, the uneven patterns 200a can be connected to other uneven patterns corresponding to a sub-pixel column adjacent thereto along the first direction, respectively.

Figure 7B:
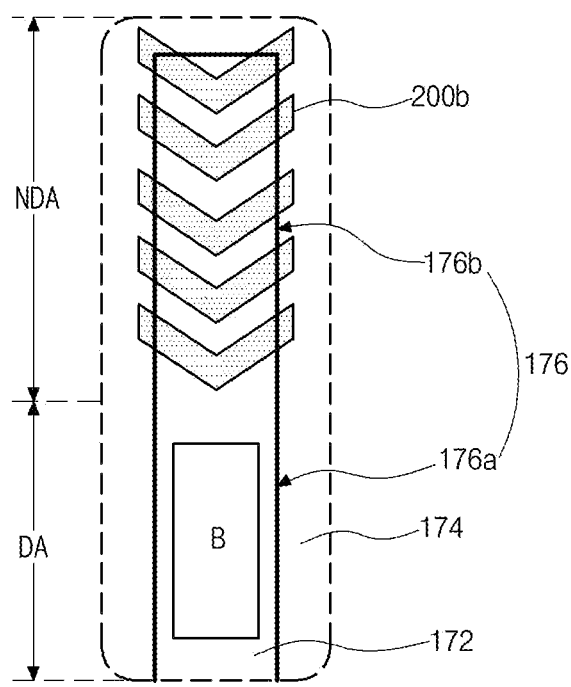
Figure 7C:
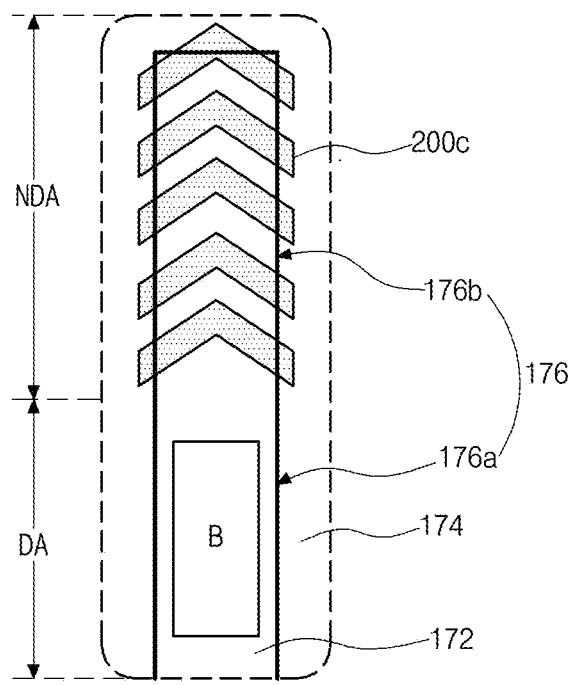

Next, in FIG. 7B and FIG. 7C, each of the uneven patterns 200b and 200c can have at least one bent portion. The uneven patterns 200b and 200c extend substantially along the first direction and are spaced apart from each other along the second direction.

As shown in FIG. 7B, the bent portions of the uneven patterns 200b can be provided to protrude toward the center of the opening 176 along the second direction. Alternatively, as shown in FIG. 7C, the bent portions of the uneven patterns 200c can be provided to protrude toward the edge of the opening 176 along the second direction.

As compared with the uneven pattern 200 of FIG. 6, the uneven patterns 200b and 200c of FIG. 7B and FIG. 7C increase the contact area between the solution dropped in the opening 176 and the under layer in the non-display area NDA, and thus it is can be further prevented that the solution dropped in the opening 176 is concentrated into the center of the display area DA.

The uneven patterns 200b and 200c can have the same length. Alternatively, the uneven patterns 200b and 200c can have different lengths, and the lengths of the uneven patterns 200b and 200c can increase or decrease as it gets far from the first portion 176a of the opening 176 along the second direction.

In addition, the uneven patterns 200b and 200c can have the same width. Alternatively, the uneven patterns 200b and 200c can have different widths, and the widths of the uneven patterns 200b and 200c can increase or decrease as it gets far from the first portion 176a of the opening 176 along the second direction.

Further, a distance between adjacent uneven patterns 200b and 200c can be the same. Alternatively, the distance between the adjacent uneven patterns 200b and 200c can increase or decrease it gets far from the first portion 176a of the opening 176 along the second direction.

At this time, as it gets far from the first portion 176a of the opening 176, the lengths of the uneven patterns 200b and 200c may decrease, the widths of the uneven patterns 200b and 200c may decrease, or the distance between the adjacent uneven patterns 200b and 200c may decrease, thereby further increasing the contact area between the solution dropped in the opening 176 and the under layer at both ends of the opening 176. Accordingly, it can be further prevented that the solution is concentrated into the center of the display area DA.

Meanwhile, the uneven patterns 200b and 200c can be connected to other uneven patterns corresponding to a sub-pixel column adjacent thereto along the first direction, respectively.

Figure 7D:
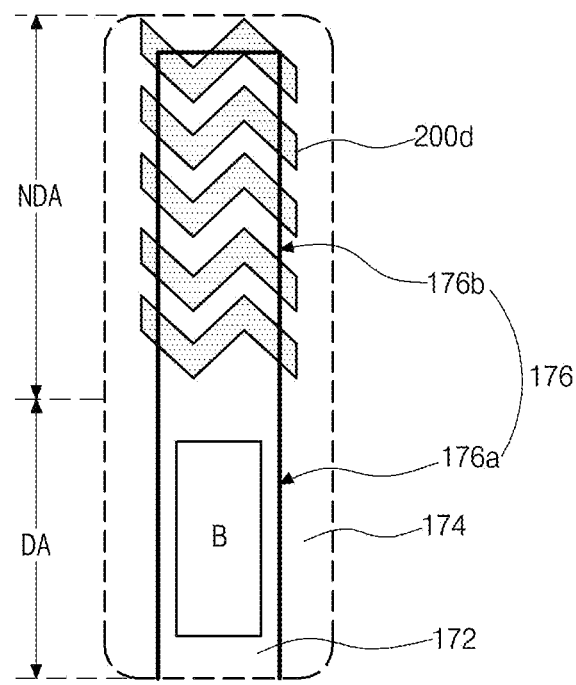

As shown in FIG. 7D, each of the uneven patterns 200d can have two bent portions. The uneven patterns 200d extend substantially along the first direction and are spaced apart from each other along the second direction. Accordingly, one of the bent portions protrudes toward the center of the opening 176 along the second direction, and the other of the bent portions protrudes toward the edge of the opening 176 along the second direction.

As compared with the uneven pattern 200 of FIG. 6, the uneven patterns 200d of FIG. 7D increase the contact area between the solution dropped in the opening 176 and the under layer in the non-display area NDA, and thus it is can be further prevented that the solution dropped in the opening 176 is concentrated into the center of the display area DA.

The uneven patterns 200d can have the same length. Alternatively, the uneven patterns 200d can have different lengths, and the lengths of the uneven patterns 200d can increase or decrease as it gets far from the first portion 176a of the opening 176 along the second direction.

In addition, the uneven patterns 200d can have the same width. Alternatively, the uneven patterns 200d can have different widths, and the widths of the uneven patterns 200d can increase or decrease as it gets far from the first portion 176a of the opening 176 along the second direction.

Further, a distance between adjacent uneven patterns 200d can be the same. Alternatively, the distance between the adjacent uneven patterns 200d can increase or decrease it gets far from the first portion 176a of the opening 176 along the second direction.

At this time, as it gets far from the first portion 176a of the opening 176, the lengths of the uneven patterns 200d may decrease, the widths of the uneven patterns 200d may decrease, or the distance between the adjacent uneven patterns 200d may decrease, thereby further increasing the contact area between the solution dropped in the opening 176 and the under layer at both ends of the opening 176. Accordingly, it can be further prevented that the solution is concentrated into the center of the display area DA.

Meanwhile, the uneven patterns 200d can be connected to other uneven patterns corresponding to a sub-pixel column adjacent thereto along the first direction, respectively.

Figure 7E:
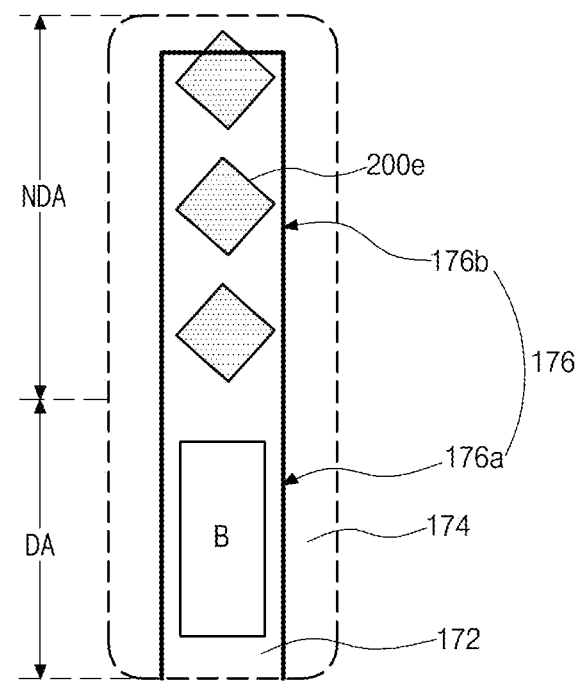

As shown in FIG. 7E, each of the uneven patterns 200e can have substantially a rhombus shape and can be spaced apart from each other along the second direction. At this time, a diagonal line of each uneven pattern 200e can have a length smaller than the width of the opening 176.

In FIG. 7E, it is described that one uneven pattern 200e is disposed in the second portion 176b of the opening 176 along the first direction, but is not limited thereto. Alternatively, two or more uneven patterns 200e can be provided in the second portion 176b of the opening 176 along the first direction.

The uneven patterns 200e can have the same size. Alternatively, the uneven patterns 200e can have different sizes, and the sizes of the uneven patterns 200e can increase or decrease as it gets far from the first portion 176a of the opening 176 along the second direction.

In addition, a distance between adjacent uneven patterns 200e can be the same. Alternatively, the distance between the adjacent uneven patterns 200e can increase or decrease as it gets far from the first portion 176a of the opening 176 along the second direction.

At this time, as it gets far from the first portion 176a of the opening 176, the sizes of the uneven patterns 200e may decrease or the distance between the adjacent uneven patterns 200e may decrease, thereby further increasing the contact area between the solution dropped in the opening 176 and the under layer at both ends of the opening 176. Accordingly, it can be further prevented that the solution is concentrated into the center of the display area DA.

Figure 7F:
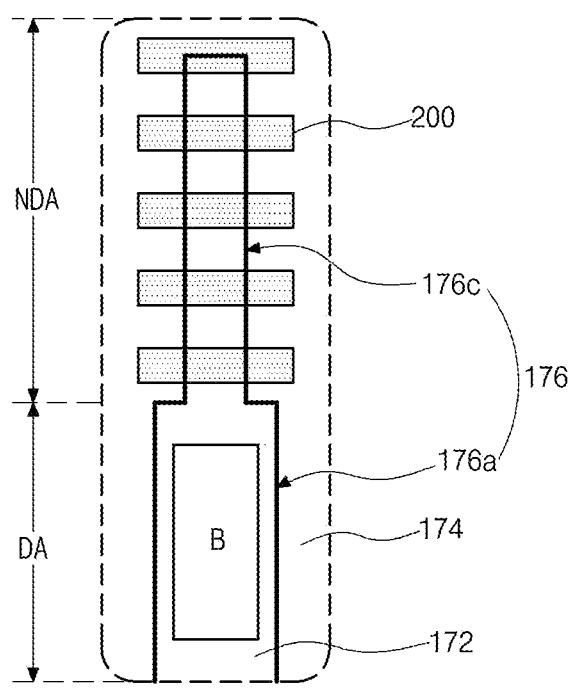

As shown in FIG. 7F, the uneven patterns 200 can extend along the first direction and can be spaced apart from each other along the second direction, and the opening 176 can have different widths in the display area DA and the non-display area NDA.

That is, the opening 176 incudes the first portion 176a disposed in the display area DA and the second portion 176c disposed in the non-display area NDA, and the width of the second portion 176c can be smaller than the width of the first portion 176a.

As compared with the uneven pattern 200 of FIG. 6, since the opening 176 of FIG. 7F includes the second portion 176c corresponding to the non-display area NDA that has the smaller width than the first portion 176a corresponding to the display area DA, it is can be further prevented due to a capillary phenomenon that the solution dropped in the opening 176 is concentrated into the center of the display area DA.

In the first embodiment of the present disclosure, it is described that the uneven pattern 200 is formed on the overcoat layer, but is not limited thereto. The location of the uneven pattern 200 can be changed.

That is, as long as the under layer under the light-emitting layer has the unevenness, the uneven pattern can be formed under the overcoat layer. At this time, the uneven pattern can include one or more patterns having a relatively high step difference, and the one or more patterns can overlap each other. The one or more patterns can be formed of an additional insulating material or can be formed of the same metal material and on the same layer as the line or electrode.

Meanwhile, the red, green and blue light-emitting diodes provided respectively at the red, green and blue sub-pixels are formed using light-emitting materials having different properties. Thus, the red, green and blue light-emitting diodes have different lifetimes and efficiencies, and the lifetime of the electroluminescent display device can be lowered by the difference in the lifetimes of the light-emitting diodes.

Accordingly, in the present disclosure, by differentiating the sizes of the red, green and blue sub-pixels, the lifetimes and efficiencies of the light-emitting diodes provided at respective sub-pixels can be optimized, thereby solving the problem of lowering the lifetime of the electroluminescent display device and improving the lifetime of the electroluminescent display device. For this, an electroluminescent display device according to a second embodiment of the present disclosure will be described with reference to FIG. 8.

Figure 8:
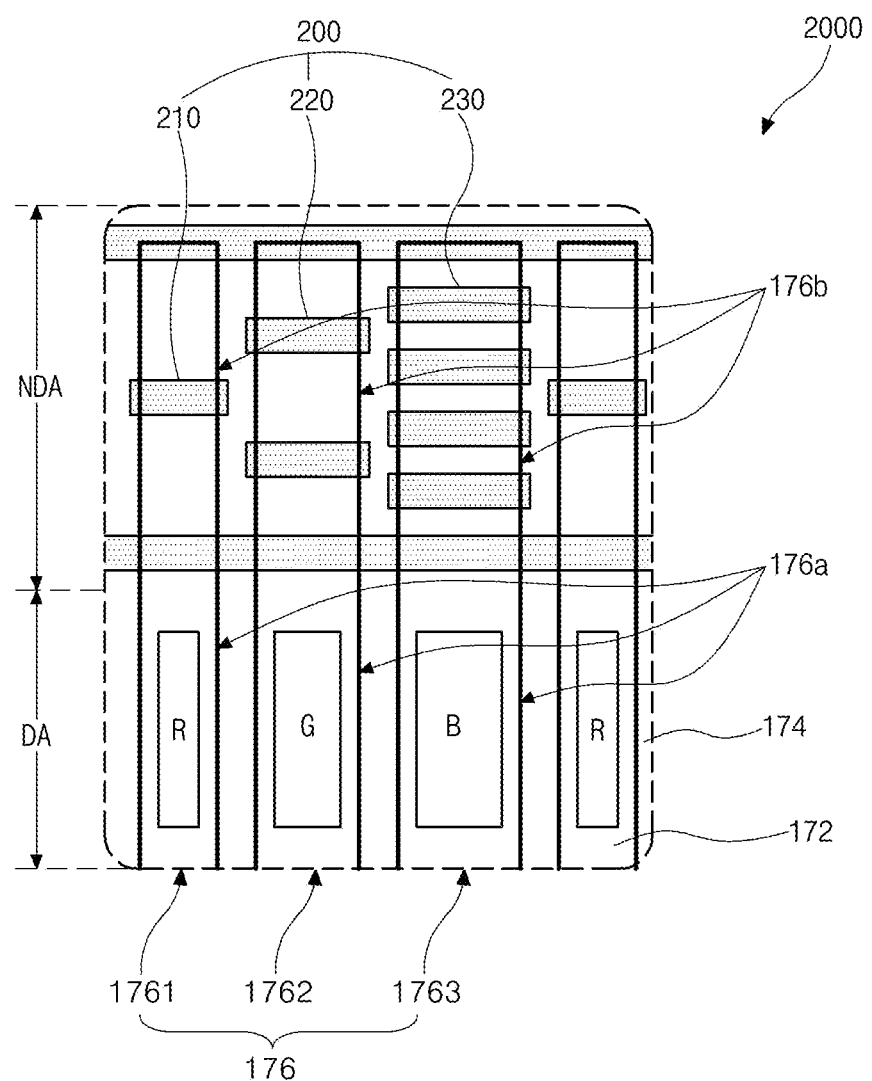
FIG. 8 is a schematically enlarged plan view of an electroluminescent display device according to a second embodiment of the present disclosure.

FIG. 8 is a schematically enlarged plan view of an electroluminescent display device according to a second embodiment of the present disclosure. The electroluminescent display device of the second embodiment has the same configuration as that of the first embodiment except for sizes of the sub-pixels, sizes of the openings, and the uneven patterns. The same parts as that of the first embodiment are designated by the same reference signs, and explanation for the same parts will be shortened or omitted.

As shown in FIG. 8, in the electroluminescent display device 2000 according to the second embodiment of the present disclosure, the red, green and blue sub-pixels R, G and B are sequentially disposed along the first direction in the display area DA. In addition, although not shown in the figure, the same color sub-pixels R, G and B are disposed along the second direction perpendicular to the first direction.

Here, the red, green and blue sub-pixels R, G and B have different sizes. The sizes of the red, green and blue sub-pixels R, G and B are determined by considering the lifetimes of the light-emitting diodes provided at respective sub-pixels. For example, the size of the green sub-pixel G may be larger than the size of the red sub-pixel R and smaller than the size of the blue sub-pixel B. At this time, the red, green and blue sub-pixels R, G and B can have the same length along the second direction and can have different widths along the first direction. The width of the green sub-pixel G can be larger than the width of the red sub-pixel R and smaller than the width of the blue sub-pixel B. However, the present disclosure is not limited thereto.

The red, green and blue sub-pixels R, G and B can be defined by first and second banks 172 and 174.

More specifically, the first bank 172 is disposed between adjacent same color sub-pixels R, G and B and between adjacent different color sub-pixels R, G and B. The first bank 172 can surround each sub-pixel R, G and B.

Alternatively, the first bank 172 can be omitted between the adjacent different color sub-pixels R, G and B. That is, the first bank 172 can be formed only between the adjacent sub-pixels R, G and B along the second direction and can extend in the first direction.

In addition, the first bank 172 is formed in the non-display area NDA. Alternatively, the first bank 172 can be removed in the non-display area NDA.

Next, the second bank 174 is formed on the first bank 172. The second bank 174 has the opening 176 corresponding to the same color sub-pixel column and is disposed between adjacent different color sub-pixels R, G and B along the first direction.

Here, the opening 176 includes first, second and third openings 1761, 1762 and 1763 corresponding to the red, green and blue sub-pixels R, G and B columns, respectively. The first, second and third openings 1761, 1762 and 1763 have different widths. For example, the width of the second opening 1762 can be larger than the width of the opening 1761 and smaller than the width of the third opening 1763, but is not limited thereto.

The first, second and third openings 1761, 1762 and 1763 extend into the non-display area NDA. Accordingly, each of the first, second and third openings 1761, 1762 and 1763 includes the first portion 176a corresponding to the display area DA and the second portion 176b corresponding to the non-display area NDA.

The second portions 176b of the first, second and third openings 1761, 1762 and 1763 can have the same width as the first portions 176a of the first, second and third openings 1761, 1762 and 1763. Alternatively, the second portions 176b of the first, second and third openings 1761, 1762 and 1763 can have a narrower width of the first portions 176a of the first, second and third openings 1761, 1762 and 1763.

Meanwhile, the uneven patterns 200 are formed in the non-display area NDA. The uneven patterns 200 can be disposed under the first bank 172. Alternatively, the first bank 172 can be removed in the non-display area NDA, thereby exposing the uneven patterns 200.

Here, the uneven patterns 200 include first, second and third patterns 210, 220 and 230 corresponding to the first, second and third openings 1761, 1762 and 1763, respectively. At this time, the first, second and third patterns 210, 220 and 230 have different numbers. For example, the number of the second patterns 220 is larger than the number of the first patterns 210 and smaller than the number of the third patterns 230, but is not limited thereto.

The number of the uneven patterns 200 can be proportional to the width of the opening 176. That is, as the width of the opening 176 increases, the number of the uneven patterns 200 can increase. Here, as the width of the opening 176 increases, the solution is further concentrated into the center of the display area DA. Accordingly, by increasing the number of the uneven patterns 200, the contact area between the solution dropped in the opening 176 and the under layer is increased in the non-display area NDA.

Additionally, at least one patterns of the first, second and third patterns 210, 220 and 230 can be connected to each other. For example, the outermost first, second and third patterns 210, 220 and 230, which are disposed at both ends along the second direction, can be connected to each other, but is not limited thereto.

As described above, in the electroluminescent display device 2000 according to the second embodiment of the present disclosure, the red, green and blue sub-pixels R, G and B are configured to have different sizes, and thus the lifetimes and efficiencies of the light-emitting diodes provided at respective sub-pixels can be optimized.

In addition, the uneven patterns 200 are provided to correspond to the opening 176 of the non-display area NDA and the uneven patterns 200 have different numbers corresponding to the red, green and blue sub-pixel columns, respectively. Therefore, it can be prevented that the solution dropped in the opening 176 corresponding to each of the red, green and blue sub-pixel rows is concentrated into the center of the display area DA.

Meanwhile, in the above embodiments, it is described that the uneven patterns are provided as additional patterns, but the uneven patterns can be variously configured.

Figure 9:
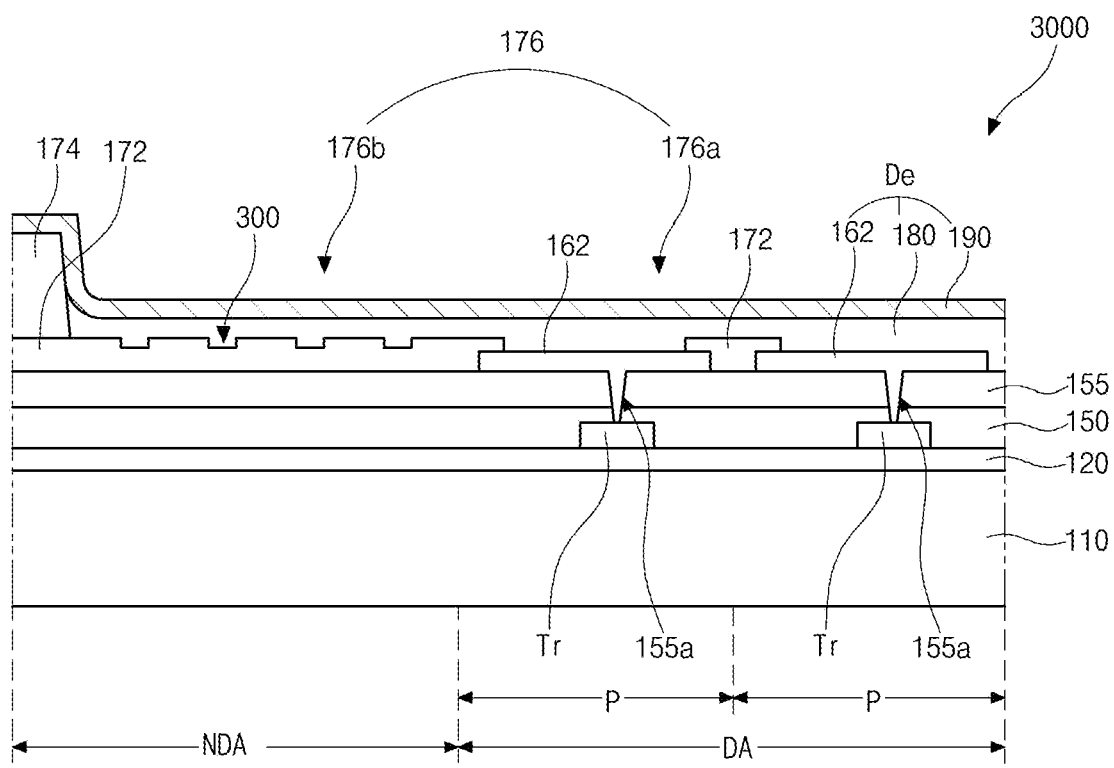
FIG. 9 is a schematic cross-sectional view of an electroluminescent display device according to a third embodiment of the present disclosure.

FIG. 9 is a schematic cross-sectional view of an electroluminescent display device according to a third embodiment of the present disclosure. The electroluminescent display device of the third embodiment has the same configuration as that of the first embodiment except for the uneven pattern. The same parts as that of the first embodiment are designated by the same reference signs, and explanation for the same parts will be shortened or omitted.

As shown in FIG. 9, in the electroluminescent display device 3000 according to the third embodiment of the present disclosure, the uneven pattern can be a depressed portion 300 provided at the top surface of the first bank 172.

More particularly, the display area DA and the non-display area NDA are defined on the substrate 110, and the plurality of pixel regions P respectively corresponding to the red, green and blue sub-pixels R, G and B are defined in the display area DA. The buffer layer 120 is formed substantially on the entire surface of the substrate 110, and the thin film transistor Tr is formed in each pixel region P on the buffer layer 120. The passivation layer 150 and the overcoat layer 155 are sequentially formed on the thin film transistor Tr substantially over the entire surface of the substrate 110, and the first electrode 162 is formed on the overcoat layer 155 in each pixel region P. The first electrode 162 contacts the drain electrode of the thin film transistor Tr through the drain contact hole 155a formed in the overcoat layer 155 and the passivation layer 150.

Next, the first bank 172 of a hydrophilic property is formed on the first electrode 162. The first bank 172 overlaps and covers edges of the first electrode 162. In addition, the first bank 172 is formed substantially all over the non-display area NDA.

In the non-display area NDA, the first bank 172 has at least one depressed portion 300 at the top surface thereof. Accordingly, the top surface of the first bank 172 has the unevenness in the non-display area NDA.

Here, the depth of the depressed portion 300 is smaller than the thickness of the first bank 172. The depressed portion 300 can have the planar structures shown in FIG. 6 and FIGS. 7A to 7E, but is not limited thereto.

The depressed portion 300 can be formed through a process of forming the first bank 172, and an additional process is not required to form the depressed portion 300. That is, the first bank 172 having the depressed portion 300 can be formed through a photolithographic process using a halftone mask that includes a light-blocking portion, a light-transmitting portion and a half light-transmitting portion. At this time, the half light-transmitting portion of the halftone mask corresponds to the depressed portion 300.

The second bank 174 of a hydrophobic property is formed on the first bank 172. The second bank 174 has the opening 176 corresponding to the same color sub-pixel column, and the opening 176 extends into the non-display area NDA.

The opening 176 includes the first portion 176a disposed in the display area DA and the second portion 176b disposed in the non-display area NDA. The first portion 176a of the opening 176 exposes the first electrodes 162 of the same color sub-pixel column and the first bank 172 between adjacent first electrodes 162, and the second portion 176b exposes the first bank 172 having the depressed portion 300.

The light-emitting layer 180 is formed on the first electrode 162 exposed through the opening 176 of the second bank 174 in each pixel region P. At this time, the light-emitting layer 180 is also formed on the first bank 172 exposed through the first portion 176a of the opening 176 between adjacent same color sub-pixels R, G and B, and the light-emitting layer 180 on the first bank 172 is connected to the light-emitting layer 180 on the first electrode 162 in the pixel region P adjacent thereto to thereby form one body.

Additionally, the light-emitting layer 180 is also formed on the first bank 172 exposed through the second portion 176b of the opening 176 in the non-display area NDA. The light-emitting layer 180 of the non-display area NDA is connected to the light-emitting layer 180 of the pixel region P of the display area DA to thereby form one body.

Here, since the top surface of the first bank 172 has the unevenness due to the depressed portion 300, the bottom surface of the light-emitting layer 180, which contacts the top surface of the first bank 172, also has unevenness. At this time, the concave portion of the bottom surface of the light-emitting layer 180 corresponds to the convex portion of the top surface of the first bank 172, and the convex portion of the bottom surface of the light-emitting layer 180 corresponds to the concave portion of the top surface of the first bank 172.

The light-emitting layer 180 is formed through a solution process. Here, the solutions dropped into respective pixel regions P corresponding to the same color sub-pixels through different nozzles are connected to each other, and the light-emitting layer 180 is formed by drying the solutions. Accordingly, the deviation in the dropping amounts between the nozzles is minimized, and the thicknesses of the light-emitting layers 180 formed in the respective pixel regions P can be uniform.

At this time, since the configuration under the light-emitting layer 180 corresponding to the non-display area NDA, that is, the top surface of the first bank 172 is configured to have the unevenness due to the depressed portion 300, the contact area between the light-emitting layer 180 and the first bank 172 in the non-display area NDA increases, and the adhesion and the frictional force between the light-emitting layer 180 and the first bank 172 increase. Accordingly, it is prevented that the solution dropped in the opening 176 is concentrated into the center of the display area DA.

Next, the second electrode 190 is formed on the light-emitting layer 180 and the second bank 174. The first electrode 162, the light-emitting layer 180, and the second electrode 190 constitute a light-emitting diode De.

In the electroluminescent display device 3000 according to the third embodiment of the present disclosure, since the top surface of the first bank 172 and the bottom surface of the light-emitting layer 180 in the non-display area NDA have the unevenness due to the depressed portion 300 and the depressed portion 300 is formed through the process of forming the first bank 172, the manufacturing process and cost can be reduced as compared with the first embodiment in which the uneven pattern is formed through the additional process.

Figure 10:
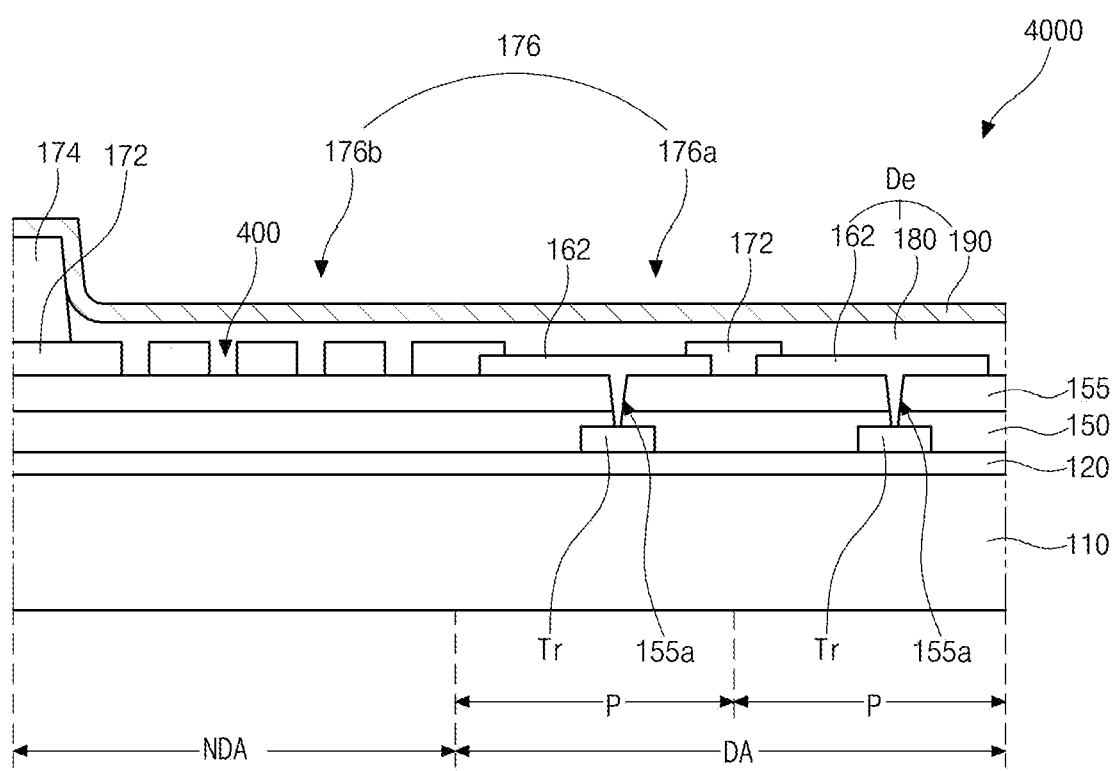
FIG. 10 is a schematic cross-sectional view of an electroluminescent display device according to a fourth embodiment of the present disclosure.

FIG. 10 is a schematic cross-sectional view of an electroluminescent display device according to a fourth embodiment of the present disclosure. The electroluminescent display device of the fourth embodiment has the same configuration as that of the first embodiment except for the uneven pattern. The same parts as that of the first embodiment are designated by the same reference signs, and explanation for the same parts will be shortened or omitted.

As shown in FIG. 10, in the electroluminescent display device 4000 according to the fourth embodiment of the present disclosure, the uneven pattern can be a hole 400 provided in the first bank 172.

More particularly, the display area NA and the non-display area NDA are defined on the substrate 110, and the plurality of pixel regions P respectively corresponding to the red, green and blue sub-pixels R, G and B are defined in the display area DA. The buffer layer 120 is formed substantially on the entire surface of the substrate 110, and the thin film transistor Tr is formed in each pixel region P on the buffer layer 120. The passivation layer 150 and the overcoat layer 155 are sequentially formed on the thin film transistor Tr substantially over the entire surface of the substrate 110, and the first electrode 162 is formed on the overcoat layer 155 in each pixel region P. The first electrode 162 contacts the drain electrode of the thin film transistor Tr through the drain contact hole 155a formed in the overcoat layer 155 and the passivation layer 150.

Next, the first bank 172 of a hydrophilic property is formed on the first electrode 162. The first bank 172 overlaps and covers edges of the first electrode 162. In addition, the first bank 172 is formed substantially all over the non-display area NDA.

In the non-display area NDA, the first bank 172 has at least one hole 400. Accordingly, the first bank 172 has the unevenness in the non-display area NDA, and the top surface of the overcoat layer 155 is exposed through the hole 400.

Here, the depth of the hole 400 is the same as the thickness of the first bank 172. The hole 400 can have the planar structures shown in FIG. 6 and FIGS. 7A to 7F, but is not limited thereto.

The hole 400 can be formed through a process of forming the first bank 172, and an additional process is not required to form the hole 400.

The second bank 174 of a hydrophobic property is formed on the first bank 172. The second bank 174 has the opening 176 corresponding to the same color sub-pixel column, and the opening 176 extends into the non-display area NDA.

The opening 176 includes the first portion 176a disposed in the display area DA and the second portion 176b disposed in the non-display area NDA. The first portion 176a of the opening 176 exposes the first electrodes 162 of the same color sub-pixel column and the first bank 172 between adjacent first electrodes 162, and the second portion 176b exposes the first bank 172 having the hole 400.

The light-emitting layer 180 is formed on the first electrode 162 exposed through the opening 176 of the second bank 174 in each pixel region P. At this time, the light-emitting layer 180 is also formed on the first bank 172 exposed through the first portion 176a of the opening 176 between adjacent same color sub-pixels R, G and B, and the light-emitting layer 180 on the first bank 172 is connected to the light-emitting layer 180 on the first electrode 162 in the pixel region P adjacent thereto to thereby form one body.

Additionally, the light-emitting layer 180 is also formed on the first bank 172 exposed through the second portion 176b of the opening 176 in the non-display area NDA. The light-emitting layer 180 of the non-display area NDA is connected to the light-emitting layer 180 of the pixel region P of the display area DA to thereby form one body.

Here, since the first bank 172 has the unevenness due to the hole 400, the bottom surface of the light-emitting layer 180, which contacts the first bank 172, also has unevenness. At this time, the concave portion of the bottom surface of the light-emitting layer 180 corresponds to the convex portion of the first bank 172, and the convex portion of the bottom surface of the light-emitting layer 180 corresponds to the concave portion of the first bank 172, that is, the hole 400. The light-emitting layer 180 is in contact with the top surface of the overcoat layer 155 through the hole 400.

The light-emitting layer 180 is formed through a solution process. Here, the solutions dropped into respective pixel regions P corresponding to the same color sub-pixels through different nozzles are connected to each other, and the light-emitting layer 180 is formed by drying the solutions. Accordingly, the deviation in the dropping amounts between the nozzles is minimized, and the thicknesses of the light-emitting layers 180 formed in the respective pixel regions P can be uniform.

At this time, since the configuration under the light-emitting layer 180 corresponding to the non-display area NDA, that is, the first bank 172 is configured to have the unevenness due to the hole 400, the contact area between the light-emitting layer 180 and the first bank 172 in the non-display area NDA increases, and the adhesion and the frictional force between the light-emitting layer 180 and the first bank 172 increase. Accordingly, it is prevented that the solution dropped in the opening 176 is concentrated into the center of the display area DA.

Next, the second electrode 190 is formed on the light-emitting layer 180 and the second bank 174. The first electrode 162, the light-emitting layer 180 and the second electrode 190 constitute a light-emitting diode De.

In the electroluminescent display device 4000 according to the fourth embodiment of the present disclosure, since the first bank 172 and the bottom surface of the light-emitting layer 180 in the non-display area NDA have the unevenness due to the hole 400 and the hole 400 is formed through the process of forming the first bank 172, the manufacturing process and cost can be reduced as compared with the first embodiment in which the uneven pattern is formed through the additional process.

Figure 11A:
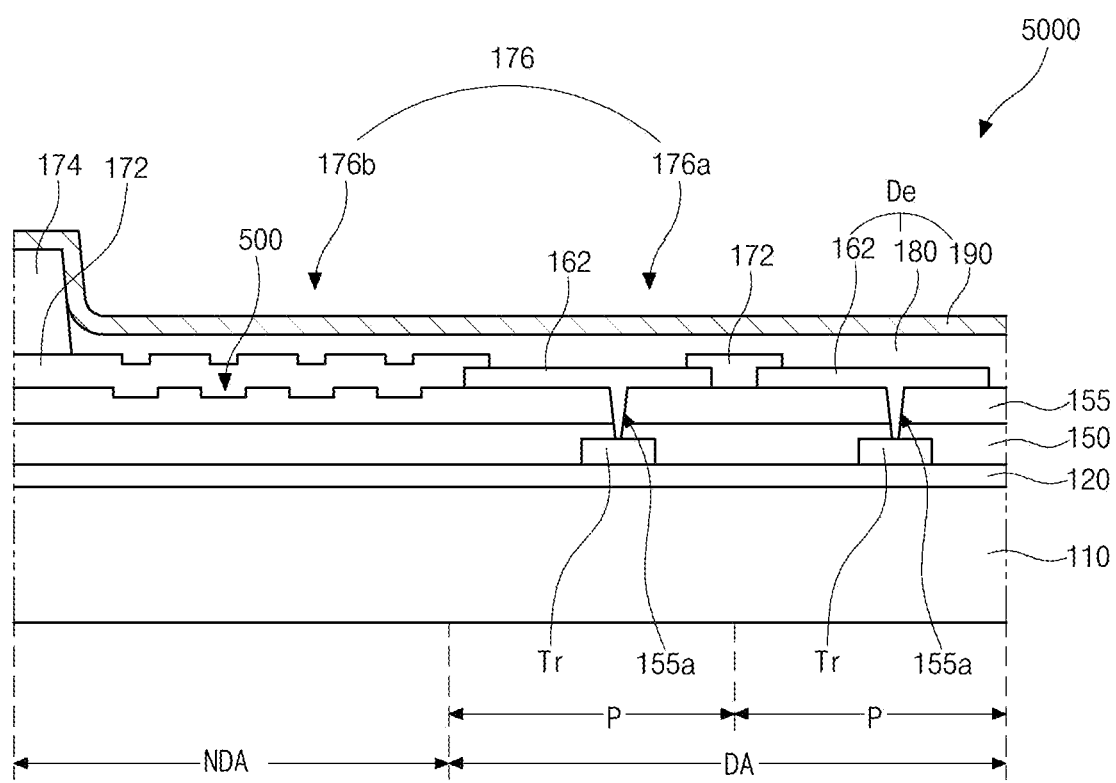
FIGS. 11A and 11B are schematic cross-sectional views of an electroluminescent display device according to a fifth embodiment of the present disclosure.
Figure 11B:
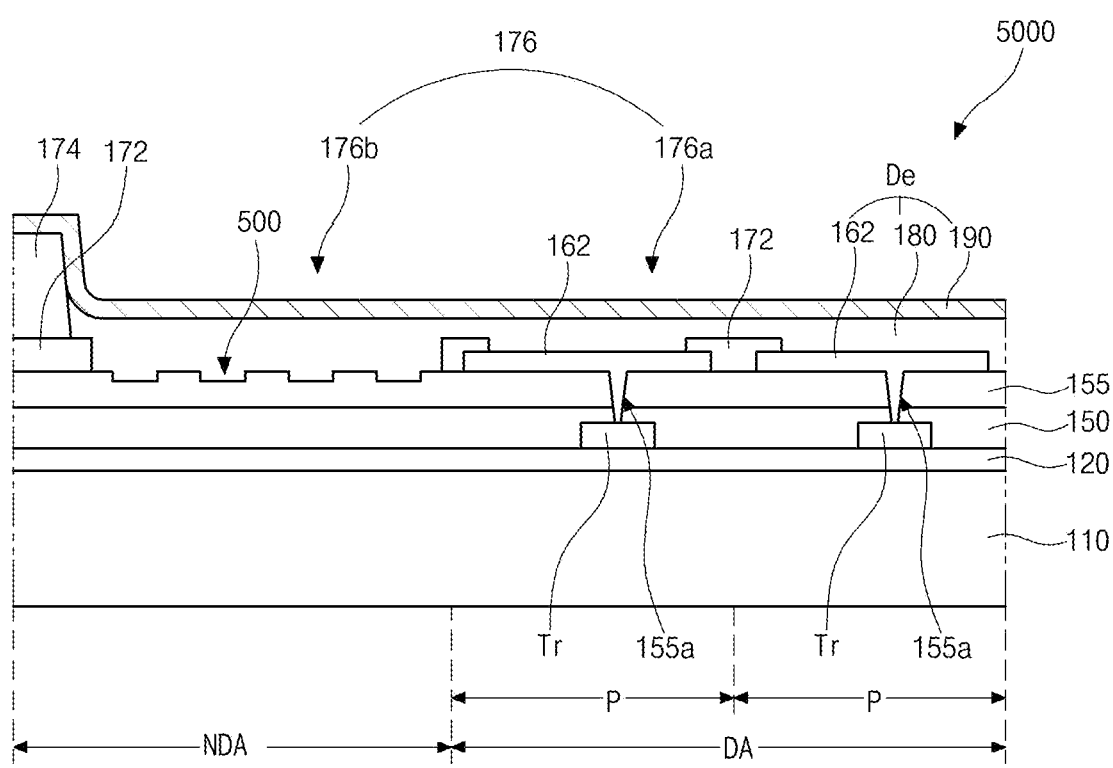

FIGS. 11A and 11B are schematic cross-sectional views of an electroluminescent display device according to a fifth embodiment of the present disclosure. The electroluminescent display device of the fifth embodiment has the same configuration as that of the first embodiment except for the uneven pattern. The same parts as that of the first embodiment are designated by the same reference signs, and explanation for the same parts will be shortened or omitted.

As shown in FIGS. 11A and 11B, in the electroluminescent display device 5000 according to the fifth embodiment of the present disclosure, the uneven pattern can be a depressed portion 500 provided at the top surface of the overcoat layer 155.

More particularly, the display area NA and the non-display area NDA are defined on the substrate 110, and the plurality of pixel regions P respectively corresponding to the red, green and blue sub-pixels R, G and B are defined in the display area DA. The buffer layer 120 is formed substantially on the entire surface of the substrate 110, and the thin film transistor Tr is formed in each pixel region P on the buffer layer 120. The passivation layer 150 and the overcoat layer 155 are sequentially formed on the thin film transistor Tr substantially over the entire surface of the substrate 110, and the first electrode 162 is formed on the overcoat layer 155 in each pixel region P. The first electrode 162 contacts the drain electrode of the thin film transistor Tr through the drain contact hole 155a formed in the overcoat layer 155 and the passivation layer 150.

At this time, the overcoat layer 155 in the non-display area NDA has at least one depressed portion 500 at the top surface thereof. Accordingly, the top surface of the overcoat layer 155 has the unevenness in the non-display area NDA.

Here, the depth of the depressed portion 500 may be smaller than the thickness of the overcoat layer 155. The depressed portion 500 can have the planar structures shown in FIG. 6 and FIGS. 7A to 7F, but is not limited thereto.

The depressed portion 500 can be formed through a process of forming the overcoat layer 155, and an additional process is not required to form the depressed portion 500. That is, the overcoat layer 155 having the depressed portion 500 can be formed through a photolithographic process using a halftone mask that includes a light-blocking portion, a light-transmitting portion and a half light-transmitting portion. At this time, the half light-transmitting portion of the halftone mask corresponds to the depressed portion 500.

The first bank 172 of a hydrophilic property is formed on the first electrode 162. The first bank 172 overlaps and covers edges of the first electrode 162. In addition, the first bank 172 is formed substantially all over the non-display area NDA.

As shown in FIG. 11A, the first bank 172 can be formed substantially all over the non-display area NDA. At this time, since the top surface of the overcoat layer 155 in the non-display area NDA has the unevenness, the top surface of the first bank 172 formed on the overcoat layer 155 also has unevenness.

Alternatively, as shown in FIG. 11B, the first bank 172 can be removed in the non-display area NDA. Accordingly, the top surface of the overcoat layer 155 having the unevenness can be exposed in the non-display area NDA.

The second bank 174 of a hydrophobic property is formed on the first bank 172. The second bank 174 has the opening 176 corresponding to the same color sub-pixel column, and the opening 176 extends into the non-display area NDA.

The opening 176 includes the first portion 176a disposed in the display area DA and the second portion 176b disposed in the non-display area NDA. The first portion 176a of the opening 176 exposes the first electrodes 162 of the same color sub-pixel column and the first bank 172 between adjacent first electrodes 162, and the second portion 176b exposes the top surface of the first bank 172 having the unevenness in FIG. 11A or the top surface of the overcoat layer 155 having the unevenness in FIG. 11B.

The light-emitting layer 180 is formed on the first electrode 162 exposed through the opening 176 of the second bank 174 in each pixel region P. At this time, the light-emitting layer 180 is also formed on the first bank 172 exposed through the first portion 176a of the opening 176 between adjacent same color sub-pixels R, G and B, and the light-emitting layer 180 on the first bank 172 is connected to the light-emitting layer 180 on the first electrode 162 in the pixel region P adjacent thereto to thereby form one body.

Additionally, the light-emitting layer 180 is also formed on the first bank 172 of FIG. 11A or on the overcoat layer 155 of FIG. 11B exposed through the second portion 176b of the opening 176 in the non-display area NDA. The light-emitting layer 180 of the non-display area NDA is connected to the light-emitting layer 180 of the pixel region P of the display area DA to thereby form one body. In FIG. 11A, the light-emitting layer 180 of the non-display area NDA is in contact with the first bank 172, and in FIG. 11B, the light-emitting layer 180 of the non-display area NDA is in contact with the overcoat layer 155 and the first bank 172.

Here, since the top surface of the first bank 172 of FIG. 11A or the top surface of the overcoat layer 155 of FIG. 11B has the unevenness, the bottom surface of the light-emitting layer 180, which contacts the top surface of the first bank 172 of FIG. 11A or the top surface of the overcoat layer 155 of FIG. 11B, also has unevenness. At this time, the concave portion of the bottom surface of the light-emitting layer 180 corresponds to the convex portion of the first bank 172 of FIG. 11A or the convex portion of the overcoat layer 155 of FIG. 11B, and the convex portion of the bottom surface of the light-emitting layer 180 corresponds to the concave portion of the first bank 172 of FIG. 11A or the concave portion of the overcoat layer 155 of FIG. 11B.

The light-emitting layer 180 is formed through a solution process. Here, the solutions dropped into respective pixel regions P corresponding to the same color sub-pixels through different nozzles are connected to each other, and the light-emitting layer 180 is formed by drying the solutions. Accordingly, the deviation in the dropping amounts between the nozzles is reduced or minimized, and the thicknesses of the light-emitting layers 180 formed in the respective pixel regions P can be uniform.

At this time, since the configuration under the light-emitting layer 180 corresponding to the non-display area NDA, that is, the top surfaces of the overcoat layer 155 and the first bank 172 of FIG. 11A or the top surface of the overcoat layer 155 of FIG. 11B is configured to have the unevenness due to the depressed portion 500 of the overcoat layer 155, the contact area between the light-emitting layer 180 and the first bank 172 or between the light-emitting layer 180 and the overcoat layer 155 in the non-display area NDA increases, and the adhesion and the frictional force between the light-emitting layer 180 and the first bank 172 or between the light-emitting layer 180 and the overcoat layer 155 increase. Accordingly, it is prevented that the solution dropped in the opening 176 is concentrated into the center of the display area DA.

Next, the second electrode 190 is formed on the light-emitting layer 180 and the second bank 174. The first electrode 162, the light-emitting layer 180 and the second electrode 190 constitute a light-emitting diode De.

In the electroluminescent display device 5000 according to the fifth embodiment of the present disclosure, since the top surface of the first bank 172 and/or the overcoat layer 155 and the bottom surface of the light-emitting layer 180 in the non-display area NDA have the unevenness due to the depressed portion 500 of the overcoat layer 155 and the depressed portion 500 is formed through the process of forming the overcoat layer 155, the manufacturing process and cost can be reduced as compared with the first embodiment in which the uneven pattern is formed through the additional process.

Meanwhile, in an electroluminescent display device according to another embodiment of the present disclosure, the uneven pattern of the non-display area NDA can be a hole provided in the overcoat layer 155, but is not limited thereto.

In the present disclosure, by forming the light-emitting layer of each sub-pixel through the solution process, a fine metal mask is omitted to thereby reduce the manufacturing costs, and a display device with a large size and high definition can be implemented.

In addition, the light-emitting layers of the same color sub-pixels are connected to each other and formed as one body, thereby reducing or minimizing the deviation in the dropping amount between nozzles and uniformly forming the thicknesses of the light-emitting layers of the sub-pixels. Therefore, the mura is prevented, thereby preventing the image quality of the display device from being lowered.

Moreover, the uneven pattern is provided in the non-display area such that the bottom surface of the light-emitting layer of the non-display area has the unevenness, and the contact area between the light-emitting layer and the under layer in the non-display area increases. Accordingly, it can be prevented that the solution dropped in the opening is concentrated into the center of the display area, thereby preventing the problem that the light-emitting layer is not formed in edges of the display area.

In addition, the uneven pattern of the non-display area is configured as the depressed portion or the hole of the first bank or the overcoat layer, and the uneven pattern can be formed without increasing the manufacturing process and cost.

Further, since the red, green and blue sub-pixels are configured to have the different sizes, the lifetimes of the red, green and blue sub-pixels can be uniform. The uneven patterns corresponding to the red, green and blue sub-pixels are configured to have the different numbers, and it can be prevented that the solutions corresponding to the red, green and blue sub-pixel columns are differently concentrated into the center of the display area due to the different sizes.

It will be apparent to those skilled in the art that various modifications and variations can be made in a device of the present disclosure without departing from the sprit or scope of the embodiments. Thus, it is intended that the present disclosure covers the modifications and variations of this invention provided they come within the scope of the appended claims and their equivalents.

What is claimed is:

1. An electroluminescent display device comprising:
    a substrate on which a display area displaying an image and a non-display area disposed outside the display area are defined;
    a plurality of sub-pixels disposed in the display area on the substrate and arranged along a first direction and a second direction;
    a light-emitting diode disposed at each of the plurality of sub-pixels and including a first electrode, a light-emitting layer, and a second electrode;
    a first bank disposed between adjacent sub-pixels along the second direction and overlapping edges of the first electrode; and
    a second bank disposed between adjacent sub-pixels along the first direction and having an opening corresponding to a column of the sub-pixels arranged along the second direction,
    wherein the opening includes a first portion corresponding to the display area and a second portion corresponding to the non-display area, and a bottom surface of the light-emitting layer in the second portion has unevenness, and
    wherein an uneven pattern is provided under the light-emitting layer in the non-display area.

2. The electroluminescent display device of claim 1, wherein the uneven pattern is a depressed portion provided at a top surface of the first bank.

3. The electroluminescent display device of claim 1, wherein the uneven pattern is a hole provided in the first bank.

4. The electroluminescent display device of claim 3, further comprising an overcoat layer between the substrate and the first electrode, wherein the light-emitting layer is in contact with the overcoat layer in the non-display area.

5. The electroluminescent display device of claim 1, further comprising an overcoat layer between the substrate and the first electrode, wherein the uneven pattern is a depressed portion provided at a top surface of the overcoat layer.

6. The electroluminescent display device of claim 1, further comprising an overcoat layer between the substrate and the first electrode, wherein the uneven pattern is formed between the first bank and the overcoat layer.

7. The electroluminescent display device of claim 1, wherein the uneven pattern includes a plurality of patterns extending along the first direction and spaced apart from each other along the second direction.

8. The electroluminescent display device of claim 7, wherein the uneven pattern has at least one bent portion.

9. The electroluminescent display device of claim 1, wherein the opening includes a first opening, a second opening, and a third opening corresponding to a first sub-pixel column, a second sub-pixel column, and a third sub-pixel column each including the sub-pixels arranged along the second direction, respectively,
    wherein a width of the second sub-pixel column is larger than a width of the first sub-pixel column and smaller than a width of the third sub-pixel column along the first direction, and
    wherein the uneven pattern includes one or more patterns corresponding to each of the first opening, the second opening, and the third opening, and a number of patterns corresponding to the second opening is different from a number of patterns corresponding to the first opening and a number of patterns corresponding to the third opening.

10. The electroluminescent display device of claim 9, wherein the number of patterns corresponding to the second opening is more than the number of patterns corresponding to the first opening and less than the number of patterns corresponding to the third opening.

11. The electroluminescent display device of claim 1, wherein the first bank has a hydrophilic property and the second bank has a hydrophobic property.

12. The electroluminescent display device of claim 1, wherein the first bank and the second bank are formed as one body.

13. The electroluminescent display device of claim 1, wherein the light-emitting layers are formed on the first electrodes of the sub-pixels arranged along the second direction and on the first bank between the sub-pixels adjacent along the second direction to thereby form one body.

14. The electroluminescent display device of claim 1, further comprising at least one thin film transistor between the substrate and the first electrode, and the first electrode is connected to the at least one thin film transistor.

* * * * *